(12) United States Patent
Yamazaki

(10) Patent No.: US 7,940,345 B2
(45) Date of Patent: May 10, 2011

(54) LIQUID CRYSTAL DISPLAY DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 188 days.

(21) Appl. No.: 12/219,023

(22) Filed: Jul. 15, 2008

(65) Prior Publication Data
US 2009/0021664 A1    Jan. 22, 2009

(30) Foreign Application Priority Data

Jul. 20, 2007  (JP) ................. 2007-190219

(51) Int. Cl.
*G02F 1/136* (2006.01)
(52) U.S. Cl. .......................... 349/43; 349/47
(58) Field of Classification Search .......... 349/43, 349/47
See application file for complete search history.

(56) References Cited

U.S. PATENT DOCUMENTS

| | | | |
|---|---|---|---|
| 4,409,134 A | 10/1983 | Yamazaki | |
| 5,084,777 A | 1/1992 | Slobodin | |
| 5,453,858 A | 9/1995 | Yamazaki | |
| 5,648,662 A | 7/1997 | Zhang et al. | |
| 5,701,167 A | 12/1997 | Yamazaki | |
| 5,766,989 A | 6/1998 | Maegawa et al. | |
| 5,796,116 A * | 8/1998 | Nakata et al. | 257/66 |
| 5,811,328 A | 9/1998 | Zhang et al. | |
| 5,849,601 A | 12/1998 | Yamazaki | |
| 6,023,075 A | 2/2000 | Yamazaki | |
| 6,124,155 A | 9/2000 | Zhang et al. | |
| 6,166,399 A | 12/2000 | Zhang et al. | |
| 6,252,249 B1 | 6/2001 | Yamazaki | |
| 6,271,062 B1 * | 8/2001 | Nakata et al. | 438/151 |
| 6,306,213 B1 | 10/2001 | Yamazaki | |
| 6,335,213 B1 | 1/2002 | Zhang et al. | |
| 6,756,258 B2 | 6/2004 | Zhang et al. | |
| 6,797,548 B2 | 9/2004 | Zhang et al. | |
| 6,847,064 B2 | 1/2005 | Zhang et al. | |
| 7,067,844 B2 | 6/2006 | Yamazaki | |

(Continued)

FOREIGN PATENT DOCUMENTS

EP    0 473 988    3/1992

(Continued)

OTHER PUBLICATIONS

Lee et al., "Top-Gate TFTs Using 13.56 MHz PECVD Microcrystalline Silicon," IEEE Electron Device Letters, IEEE, 2005, vol. 26, No. 9, pp. 637-639.

(Continued)

*Primary Examiner* — K. Cyrus Kianni
(74) *Attorney, Agent, or Firm* — Eric J. Robinson; Robinson Intellectual Property Law Office, P.C.

(57) ABSTRACT

It is an object to provide a liquid crystal display device including a thin film transistor with high electric characteristics and high reliability. As for a liquid crystal display device including an inverted staggered thin film transistor of a channel stop type, the inverted staggered thin film transistor includes a gate electrode, a gate insulating film over the gate electrode, a microcrystalline semiconductor film including a channel formation region over the gate insulating film, a buffer layer over the microcrystalline semiconductor film, and a channel protective layer which is formed over the buffer layer so as to overlap with the channel formation region of the microcrystalline semiconductor film.

18 Claims, 27 Drawing Sheets

U.S. PATENT DOCUMENTS

| | | | |
|---|---|---|---|
| 7,098,479 B1 | 8/2006 | Yamazaki | |
| 7,115,902 B1 | 10/2006 | Yamazaki | |
| 7,247,529 B2 * | 7/2007 | Shoji et al. | 438/166 |
| 7,564,058 B2 * | 7/2009 | Yamazaki et al. | 257/72 |
| 7,718,463 B2 * | 5/2010 | Yamazaki et al. | 438/72 |
| 7,732,818 B2 * | 6/2010 | Maekawa et al. | 257/72 |
| 7,738,050 B2 * | 6/2010 | Yamazaki et al. | 349/43 |
| 2002/0008819 A1 | 1/2002 | Yoshida | |
| 2004/0188685 A1 | 9/2004 | Lin et al. | |
| 2005/0017243 A1 | 1/2005 | Zhang et al. | |
| 2005/0087769 A1 * | 4/2005 | Yamazaki et al. | 257/202 |
| 2006/0027804 A1 * | 2/2006 | Yamazaki et al. | 257/59 |
| 2006/0046336 A1 * | 3/2006 | Shoji et al. | 438/30 |
| 2007/0018165 A1 | 1/2007 | Yamazaki | |
| 2008/0044962 A1 | 2/2008 | Zhang et al. | |
| 2008/0099826 A1 | 5/2008 | Lai et al. | |
| 2008/0105877 A1 * | 5/2008 | Yamazaki et al. | 257/72 |
| 2009/0001375 A1 | 1/2009 | Yamazaki et al. | |
| 2009/0002591 A1 | 1/2009 | Yamazaki et al. | |

FOREIGN PATENT DOCUMENTS

| | | |
|---|---|---|
| JP | 60-098680 | 6/1985 |
| JP | 61-087371 | 5/1986 |
| JP | 04-242724 | 8/1992 |
| JP | 06-045354 | 2/1994 |
| JP | 08-195492 | 7/1996 |
| JP | 11-121761 | 4/1999 |
| JP | 2002-246605 | 8/2002 |
| JP | 2005-049832 | 2/2005 |
| JP | 2005-167051 | 6/2005 |
| JP | 2007-005508 | 1/2007 |
| JP | 2007-035964 | 2/2007 |

OTHER PUBLICATIONS

Arai et al., "Micro Silicon Technology for Active Matrix OLED Display," SID 07 Digest, 2007, pp. 1370-1373.

Lee et al., "High-Mobility Nanocrystalline Silicon Thin-Film Transistors Fabricated by Plasma-Enhanced Chemical Vapor Deposition," Applied Physics Letters, 2005, vol. 86, pp. 222106-1~222106-3.

Lee et al., "High Mobility N-Channel and P-Channel Nanocrystalline Silicon Thin-Film Transistors," IEEE IEDM, 2005, pp. 937-940.

Lee et al., "Directly Deposited Nanocrystalline Silicon Thin-Film Transistors with Ultra High Mobilities,", Applied Physics Letters, 2006, vol. 89, 252101-1~252101-3.

Lee et al., "How to Achieve High Mobility Thin Film Transistors by Direct Deposition of Silicon Using 13.56 MHz RF PECVD?," IEEE IEDM, 2006, pp. 295-298.

Esmaeili-Rad et al., "High Stability, Low Leakage Nanocrystalline Silicon Bottom Gate Thin Film Transistors for AMOLED Displays,", IEEE IEDM, 2006, pp. 303-306.

Lee et al., "Leakage Current Mechanisms in Top-Gate Nanocrystalline Silicon Thin-Film Transistors," Applied Physics Letters, 2008, vol. 92, 083509-1~083509-3.

Esmaeili-Rad et al., "Absence of Defect State Creation in Nanocrystalline Silicon Thin-Film Transistors Deduced from Constant Current Stress Measurements," Applied Physics Letters, 2007, vol. 91, 113511-1~113511-3.

Lee et al., "Stability of nc-Si:H TFTs with Silicon Nitride Gate Dielectic," IEEE Transactions on Electron Devices, Jan. 2007, vol. 54, No. 1, pp. 45-51.

Sazonov et al., "Low-Temperature Materials and Thin Film Transistors for Flexible Electronics," Proceedings of the IEEE, Aug. 2005, vol. 93, No. 8 pp. 1420-1428.

Esmaeili-Rad et al., "Stability of Nanocrystalline Silicon Bottom-Gate Thin-Film Transistors with Silicon Nitride Gate Dielectric," American Institute of Physics, 2007, vol. 102, 064512-1~064512-7.

Lee et al., "Top-Gate TFTs Using 13.56 MHz PECVD Microcrystalline Silicon," IEEE, 2005, pp. 637-639.

Lee et al., "Postdeposition Thermal Annealing and Material Stability of 75° C. Hydrogenated Nanocrystalline Silicon Plasma-Enhanced Chemical Vapor Deposition Films," American Institute of Physics, 2005, vol. 98, 034305-1~034305-7.

* cited by examiner

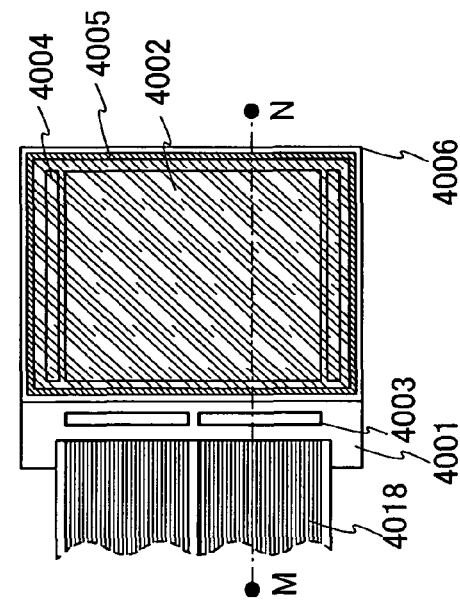
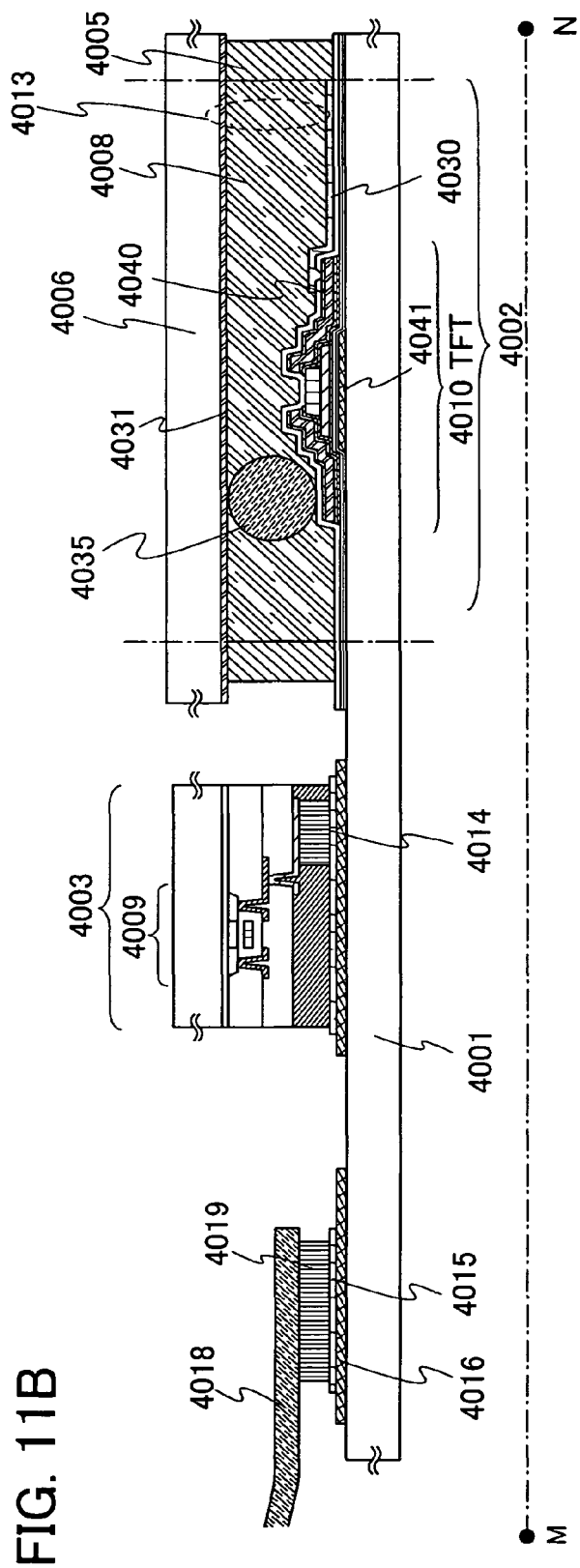
FIG. 11A
FIG. 11B

LIQUID CRYSTAL DISPLAY DEVICE

BACKGROUND OF THE INVENTION

1. Field of the Invention

The present invention relates to a liquid crystal display device including a thin film transistor at least in a pixel portion.

2. Description of the Related Art

In recent years, technology that is used to form a thin film transistor using a semiconductor thin film (with a thickness of from several nanometers to several hundreds of nanometers, approximately) formed over a substrate that has an insulating surface has been attracting attention. Thin film transistors are applied to a wide range of electronic devices like ICs and electro-optical devices, and prompt development, of thin film transistors that are to be used as switching elements in image display devices, in particular, is being pushed.

For switching elements in image display devices, a thin film transistor using an amorphous semiconductor film, a thin film transistor using a polycrystalline semiconductor film, and the like are used. As a method for forming a polycrystalline semiconductor film, technology is known in which a pulsed excimer laser beam is processed into a linear shape by an optical system and used to scan and irradiate an amorphous semiconductor film for crystallizing the amorphous semiconductor film.

Also, as switching elements in image display devices, a thin film transistor using a microcrystalline semiconductor film is used (Reference 1: Japanese Published Patent Application No. H4-242724 and Reference 2: Japanese Published Patent Application No. 2005-49832).

A known conventional method for manufacturing the thin film transistor is that an amorphous silicon film is formed over a gate insulating film; a metal film is formed thereover; and the metal film is irradiated with a diode laser beam to modify the amorphous silicon film into a microcrystalline silicon film (Reference 3: Toshiaki Arai et al., SID 07 DIGEST, 2007, pp. 1370-1373). According to this method, the metal film formed over the amorphous silicon film is provided to convert optical energy of the diode laser beam into thermal energy and should be removed in a later step to complete a thin film transistor. That is, the method is that an amorphous semiconductor film is heated only by conduction heating from a metal film to form a microcrystalline semiconductor film.

SUMMARY OF THE INVENTION

A thin film transistor using a polycrystalline semiconductor film has advantages in that its mobility is two or more orders of magnitude greater than that of a thin film transistor using an amorphous semiconductor film and a pixel portion of a display device and peripheral driver circuits thereof can be formed over the same substrate. However, the process is more complex because of crystallization of a semiconductor film, compared to the case of using an amorphous semiconductor film; accordingly, there are problems in that the yield is decreased and the cost is increased.

In view of the above-mentioned problems, it is an object of the present invention to propose a liquid crystal display device including a thin film transistor with high electric characteristics and high reliability.

As for a liquid crystal display device having an inverted staggered thin film transistor of a channel stop type in which a microcrystalline semiconductor film is used as a channel formation region, the inverted staggered thin film transistor is formed as follows: a gate insulating film is formed over a gate electrode; a microcrystalline semiconductor film (also referred to as a semi-amorphous semiconductor film) which functions as a channel formation region is formed over the gate insulating film; a buffer layer is formed over the microcrystalline semiconductor film; a channel protective layer is formed over the buffer layer so as to overlap with the channel formation region of the microcrystalline semiconductor film; a pair of source and drain regions are formed over the channel protective layer and the buffer layer; and a pair of source and drain electrodes are formed in contact with the source and drain regions.

The channel protective layer (also referred to as simply a protective layer) is provided over the channel formation region of the microcrystalline semiconductor film with the buffer layer interposed therebetween. Thus, damage which is caused in the manufacturing process to the buffer layer over the channel formation region of the microcrystalline semiconductor film (such as reduction in film thickness due to plasma or an etching agent in etching, or oxidation) can be prevented. Therefore, reliability of the thin film transistor can be improved. Further, since the buffer layer over the channel formation region of the microcrystalline semiconductor film is not etched, the buffer layer is not needed to be formed thickly and film-formation time can be shortened. Note that the channel protective layer functions as an etching stopper in etching for forming the source region and the drain region and can also be referred to as a channel stopper layer.

For the buffer layer, an amorphous semiconductor film can be used. Preferably, an amorphous semiconductor film containing at least one of nitrogen, hydrogen, and halogen is used. When the amorphous semiconductor film contains any one of nitrogen, hydrogen, and halogen, oxidation of crystals included in the microcrystalline semiconductor film can be reduced. While the microcrystalline semiconductor film has an energy gap of 1.1 eV to 1.5 eV, the buffer layer has an energy gap as large as 1.6 eV to 1.8 eV and low mobility. The typical mobility of the buffer layer is a fifth to a tenth of that of the microcrystalline semiconductor film. Thus, the channel formation region is formed with a microcrystalline semiconductor film, and the buffer layer serves a high-resistance region. The concentration of each of carbon, nitrogen, and oxygen contained in the microcrystalline semiconductor film is set at less than or equal to $3\times10^{19}$ atoms/cm$^3$, preferably, less than or equal to $5\times10^{18}$ atoms/cm$^3$. The thickness of the microcrystalline semiconductor film is preferably from 2 nm to 50 nm, more preferably, from 10 nm to 30 nm.

The buffer layer can be formed by a plasma CVD method, a sputtering method, or the like. After formation of an amorphous semiconductor film, the surface of the amorphous semiconductor film can be nitrided, hydrogenated, or halogenated through processing of the surface of the amorphous semiconductor film with nitrogen plasma, hydrogen plasma, or halogen plasma.

By provision of the buffer layer over the surface of the microcrystalline semiconductor film, oxidation of crystal grains contained in the microcrystalline semiconductor film can be reduced. Accordingly, the degree of degradation of electric characteristics of the thin film transistor can be lowered.

A microcrystalline semiconductor film can be formed over a substrate directly as a microcrystalline semiconductor film, which is a different point from the case of a polycrystalline semiconductor film. Specifically, a microcrystalline semiconductor film can be formed using silicon hydride as a source gas by use of a microwave plasma CVD apparatus with a frequency of greater than or equal to 1 GHz. A microcrystalline semiconductor film formed by the above method also includes a microcrystalline semiconductor film which has crystal grains with a diameter of 0.5 nm to 20 nm in an amorphous semiconductor. Therefore, a crystallization process after formation of the semiconductor film is not necessary, which is different from the case of the polycrystalline semiconductor film; thus, the number of steps in manufacturing a thin film transistor can be reduced, the yield of the liquid crystal display device can be improved, and the cost can be suppressed. In addition, since plasma generated by using microwaves with a frequency of greater than or equal to 1 GHz has high electron density, silicon hydride which is a source gas can be easily dissociated. Accordingly, compared to the case of using a high-frequency plasma CVD method with a frequency of several tens of MHz to several hundreds of MHz, by use of a microwave plasma CVD apparatus with a frequency of greater than or equal to 1 GHz, the microcrystalline semiconductor film can be easily formed, a film-formation rate can be increased, and mass productivity of the liquid crystal display device can be improved.

In addition, a thin film transistor (TFT) is manufactured using the microcrystalline semiconductor film, and a liquid crystal display device is manufactured using the thin film transistor for a pixel portion, and further, for a driver circuit. The thin film transistor using a microcrystalline semiconductor film has a mobility of 1 $cm^2/V \cdot sec$ to 20 $cm^2/V \cdot sec$, which is 2 to 20 times higher than that of the thin film transistor using an amorphous semiconductor film. Therefore, part of the driver circuit or the entire driver circuit can be formed over the same substrate as that of the pixel portion, so that a system-on-panel can be manufactured.

The gate insulating film, the microcrystalline semiconductor film, the buffer layer, the channel protective layer, and the semiconductor film to which an impurity element imparting one conductivity type is added which forms the source and drain regions may be formed in one reaction chamber, or different reaction chambers according to a kind of a film.

Before a substrate is carried into a reaction chamber to perform film formation, it is preferable to perform cleaning, flush (washing) treatment (hydrogen flush using hydrogen as a flush substance, silane flush using silane as a flush substance, or the like), and coating by which the inner wall of each reaction chamber is coated with a protective film (the coating is also referred to as pre-coating treatment). Pre-coating treatment is treatment in which plasma treatment is performed by flowing of a deposition gas in a reaction chamber to coat the inner wall of the reaction chamber with a thin protective film which is a film to be formed, in advance. By the flush treatment and the pre-coating treatment, a film to be formed can be prevented from being contaminated by an impurity element such as oxygen, nitrogen, or fluorine in the reaction chamber.

According to one aspect of the present invention, a liquid crystal display device includes a gate electrode; a gate insulating film over the gate electrode; a microcrystalline semiconductor film including a channel formation region over the gate insulating film; a buffer layer over the microcrystalline semiconductor film; a channel protective layer which is provided over the buffer layer so as to overlap with the channel formation region of the microcrystalline semiconductor film; a source region and a drain region over the channel protective layer and the buffer layer; and a source electrode and a drain electrode over the source region and the drain region.

According to another aspect of the present invention, a liquid crystal display device includes a gate electrode; a gate insulating film over the gate electrode; a microcrystalline semiconductor film including a channel formation region over the gate insulating film; a buffer layer over the microcrystalline semiconductor film; a channel protective layer which is provided over the buffer layer so as to overlap with the channel formation region of the microcrystalline semiconductor film; a source region and a drain region over the channel protective layer and the buffer layer; a source electrode and a drain electrode over the source region and the drain region; and an insulating film which covers part of the channel protective layer, the source electrode, and the drain electrode.

In the above structures, a pixel electrode is provided to be electrically connected to the source electrode or the drain electrode of the channel stop type thin film transistor, and a liquid crystal element and the thin film transistor are electrically connected to each other through the pixel electrode.

The liquid crystal display device includes a display element. As the display element, a liquid crystal element (liquid crystal display element) can be used. Further, a display medium whose contrast is changed by an electric effect, such as an electronic ink, can be used.

In addition, the liquid crystal display device includes a panel in which a liquid crystal element is sealed, and a module in which an IC and the like including a controller are mounted on the panel. The present invention further relates to one mode of an element substrate before the liquid crystal element is completed in a manufacturing process of the liquid crystal display device, and the element substrate is provided with a means to supply current to the liquid crystal element in each of a plurality of pixels. Specifically, the element substrate may be in a state provided with only a pixel electrode of the liquid crystal element, a state after a conductive film to be a pixel electrode is formed and before the conductive film is etched to form the pixel electrode, or other states.

Note that a liquid crystal display device in this specification means an image display device, a display device, or a light source (including a lighting device). Further, the liquid crystal display device includes any of the following modules in its category: a module to which a connector such as an FPC (flexible printed circuit), TAB (tape automated bonding) tape, or a TCP (tape carrier package) is attached; a module having TAB tape or a TCP which is provided with a printed wiring board at the end thereof; and a module having an IC (integrated circuit) directly mounted on a substrate provided with a display element by a COG (chip on glass) method.

According to the present invention, a liquid crystal display device including a thin film transistor with high electric characteristics and high reliability can be manufactured.

BRIEF DESCRIPTION OF THE DRAWINGS

FIGS. 11A and 11B show a liquid crystal display device of the present invention.

DETAILED DESCRIPTION OF THE INVENTION

Figure 1:
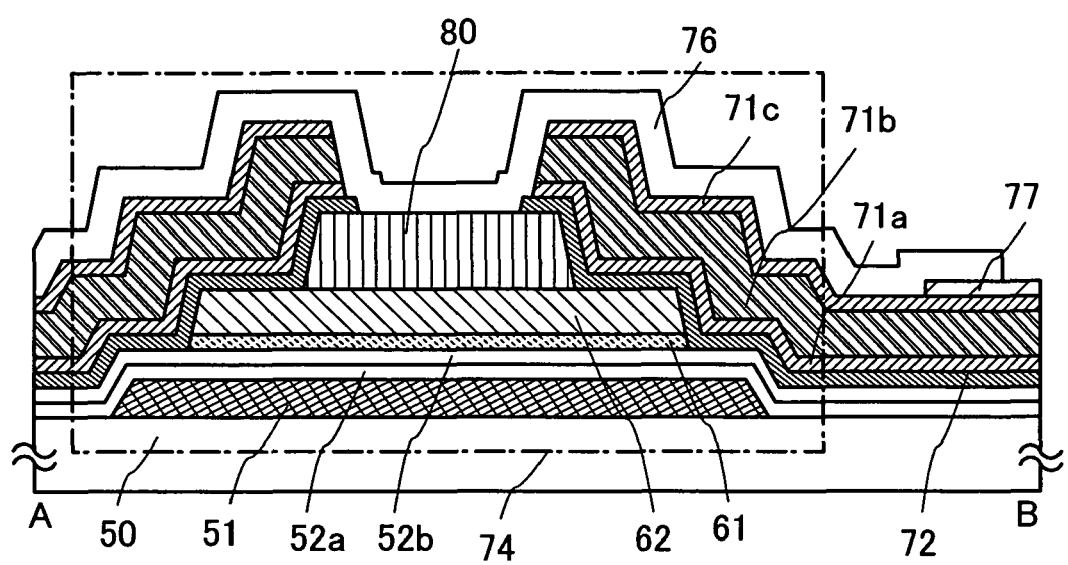
FIG. 1 is an explanatory view of a liquid crystal display device of the present invention.

Embodiment modes of the present invention will be described in detail with reference to the accompanying drawings. Note that the present invention is not limited to the following description, and it is easily understood by those skilled in the art that modes and details thereof can be modified in various ways without departing from the spirit and the scope of the present invention. Therefore, the present invention should not be interpreted as being limited to the description of the embodiment modes to be given below. In the structure of the present invention to be described below, the same reference numerals are commonly given to the same components or components having similar functions in different drawings, and repetitive description will be omitted.

Embodiment Mode 1

This embodiment mode will describe a thin film transistor which is used for a liquid crystal display device and a manufacturing process of the thin film transistor with reference to FIG. 1, FIGS. 2A to 2D, FIGS. 3A to 3C, and FIGS. 4A to 4D. FIG. 1, FIGS. 2A to 2D, and FIGS. 3A to 3C are cross-sectional views showing a thin film transistor and a manufacturing process thereof, and FIGS. 4A to 4D are plane views showing a region in a pixel where the thin film transistor and a pixel electrode are connected to each other. FIG. 1, FIGS. 2A to 2D, and FIGS. 3A to 3C are cross-sectional views showing the thin film transistor in a cross section taken along a line A-B in FIGS. 4A to 4D, and a manufacturing process thereof.

As for a thin film transistor including a microcrystalline semiconductor film, an n-type thin film transistor has higher mobility than a p-type thin film transistor; thus, an n-type thin film transistor is more suitable for a driver circuit. However, in the present invention, either an n-type or p-type thin film transistor can be used. With any polarity of a thin film transistor, it is preferable that all the thin film transistors formed over one substrate have the same polarity so that the number of manufacturing steps is reduced. Here, an n-channel thin film transistor will be described.

FIG. 1 shows a bottom gate thin film transistor 74 of a channel stop type (also referred to as a channel protective type) of this embodiment mode.

In FIG. 1, the channel stop type thin film transistor 74 is provided over a substrate 50. The channel stop type thin film transistor 74 includes a gate electrode 51, gate insulating films 52a and 52b, a microcrystalline semiconductor film 61, a buffer layer 62, a channel protective layer 80, source and drain regions 72, and source and drain electrodes 71a, 71b, and 71c. A pixel electrode 77 is provided so as to be in contact with the source or drain electrode 71c. An insulating film 76 is provided so as to cover the thin film transistor 74 and part of the pixel electrode 77. Note that FIG. 1 corresponds to FIG. 4D.

The channel protective layer 80 is provided over a channel formation region of the microcrystalline semiconductor film 61 with the buffer layer 62 interposed therebetween. Thus, damage which is caused in the manufacturing process to the buffer layer 62 over the channel formation region of the microcrystalline semiconductor film 61 (such as reduction in film thickness due to plasma or an etching agent in etching, or oxidation) can be prevented. Therefore, reliability of the thin film transistor 74 can be improved. Further, the buffer layer 62 over the channel formation region of the microcrystalline semiconductor film 61 is not etched, so that the buffer layer 62 is not needed to be formed thickly and film-formation time can be shortened.

End portions of the microcrystalline semiconductor film 61 are positioned more inwardly than those of the gate electrode 51 with which the microcrystalline semiconductor film 61 overlaps with the gate insulating films 52a and 52b interposed therebetween, so that the microcrystalline semiconductor film 61 is provided so as not to extend beyond the gate electrode 51. Thus, the microcrystalline semiconductor film 61 can be formed in a flat region over the gate electrode 51 and the gate insulating films 52a and 52b, and can be a film which covers the underlying layers adequately and has uniform characteristics (crystalline structure) throughout the film.

Figure 2A:
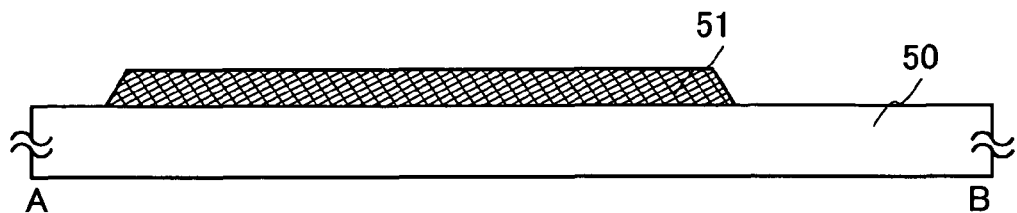
FIGS. 2A to 2D show a method for manufacturing a liquid crystal display device of the present invention.
Figure 4A:
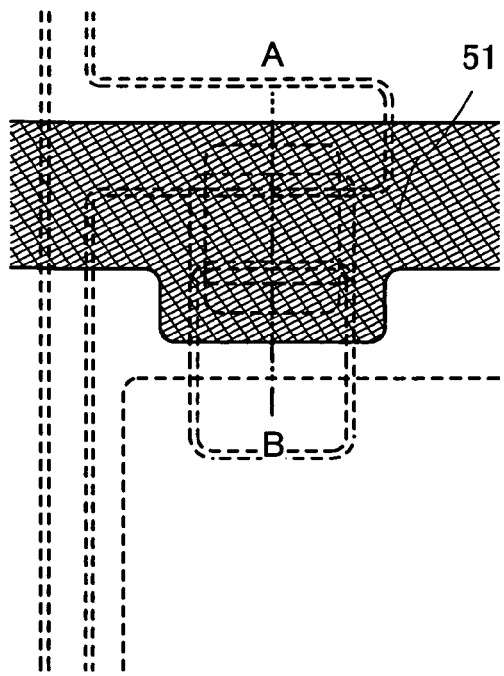
FIGS. 4A to 4D show a method for manufacturing a liquid crystal display device of the present invention.
Figure 4B:
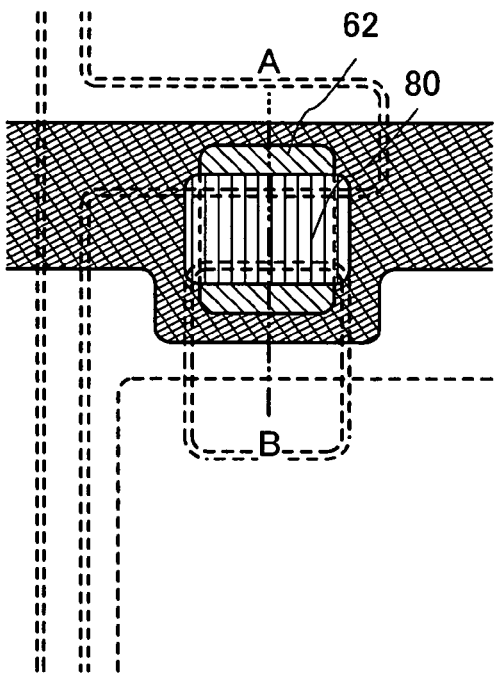

Hereinafter, a manufacturing method will be described in detail. The gate electrode 51 is formed over the substrate 50 (FIG. 2A and FIG. 4A). FIG. 2A is a cross-sectional view showing a cross section taken along a line A-B in FIG. 4A. As the substrate 50, a plastic substrate having heat resistance that can withstand a processing temperature of the manufacturing process or the like as well as a non-alkaline glass substrate manufactured by a fusion method or a float method such as a substrate of a barium borosilicate glass, an aluminoborosilicate glass, or an aluminosilicate glass, or a ceramic substrate can be used. Alternatively, a metal substrate such as a stainless steel alloy substrate, provided with an insulating film over the surface, may also be used. As the substrate 50, a substrate having a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like can be used.

The gate electrode 51 is formed of a metal material such as titanium, molybdenum, chromium, tantalum, tungsten, or aluminum, or an alloy material thereof. The gate electrode 51 can be formed as follows: a conductive film is formed over the substrate 50 by a sputtering method or a vacuum evaporation method, a mask is formed by a photolithography technique or an ink-jet method over the conductive film, and the conductive film is etched using the mask. Alternatively, the gate electrode 51 can be formed by discharging a conductive nano-paste of silver, gold, copper, or the like by an ink-jet method and baking it. Note that a nitride film formed of the above metal material may be provided between the substrate 50 and the gate electrode 51 to improve adherence of the gate electrode 51 to the substrate 50 and to prevent, as a barrier metal, diffusion of impurities to a base film and the substrate. The gate electrode 51 may have a layered structure, and a structure can be used in which, from the substrate 50 side, an aluminum film and a molybdenum film are stacked, a copper film and a molybdenum film are stacked, a copper film and a titanium nitride film are stacked, a copper film and a tantalum nitride film are stacked, or the like. In the above layered structure, a molybdenum film or a nitride film such as a titanium nitride film or a tantalum nitride film which is formed in the upper layer has an effect as a barrier metal.

Since semiconductor films and wirings are formed over the gate electrode 51, the gate electrode 51 is preferably processed to have tapered end portions so that the semiconductor films and the wirings thereover are not disconnected. Further, although not illustrated, wirings connected to the gate electrode can also be formed at the same time when the gate electrode is formed.

Figure 2B:
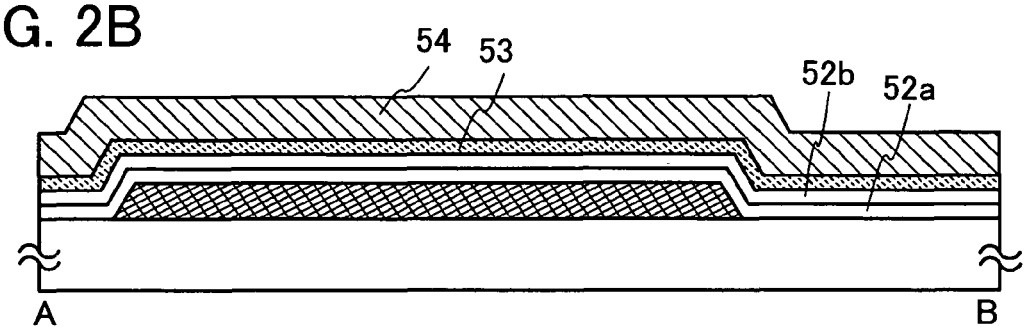

Next, the gate insulating films 52a and 52b, a microcrystalline semiconductor film 53, and a buffer layer 54 are formed in sequence over the gate electrode 51 (FIG. 2B).

The microcrystalline semiconductor film 53 may be formed over the surface of the gate insulating film 52b which is being (or which has been) affected by hydrogen plasma. By formation of a microcrystalline semiconductor film over a gate insulating film which has been affected by hydrogen plasma, crystal growth of microcrystal can be accelerated. In addition, lattice distortion at the interface between the gate insulating film and the microcrystalline semiconductor film can be decreased, and interface characteristics of the gate insulating film and the microcrystalline semiconductor film can be improved. Accordingly, electric characteristics and reliability of the microcrystalline semiconductor film obtained can be improved.

Note that the gate insulating films 52a and 52b, the microcrystalline semiconductor film 53, and the buffer layer 54 may be formed successively without being exposed to the atmosphere. When the gate insulating films 52a and 52b, the microcrystalline semiconductor film 53, and the buffer layer 54 are formed successively without being exposed to the atmosphere, an interface between the films can be formed without being contaminated with atmospheric components or impurity elements contained in the atmosphere. Thus, variation in characteristics of the thin film transistors can be reduced.

The gate insulating films 52a and 52b can each be formed using a silicon oxide film, a silicon nitride film, a silicon oxynitride film, or a silicon nitride oxide film by a CVD method, a sputtering method, or the like. In addition, the gate insulating films 52a and 52b can be formed by stacking a silicon nitride film or a silicon nitride oxide film, and a silicon oxide film or a silicon oxynitride film in sequence. Further, the gate insulating film can be formed with a three-layer structure in which a silicon nitride film or a silicon nitride oxide film, a silicon oxide film or a silicon oxynitride film, and a silicon nitride film or a silicon nitride oxide film are stacked in sequence from the substrate side instead of a two-layer structure. In addition, the gate insulating film may be formed with a single layer of a silicon oxide film, a silicon nitride film, a silicon oxynitride film, or a silicon nitride oxide film. Furthermore, it is preferable to form the gate insulating film by use of a microwave plasma CVD apparatus with a frequency of greater than or equal to 1 GHz. A silicon oxynitride film or a silicon nitride oxide film formed by use of a microwave plasma CVD apparatus has high resistance to voltage, so that reliability of the thin film transistor formed later can be improved.

As an example of the three-layer structure of the gate insulating film, over the gate electrode, a silicon nitride film or a silicon nitride oxide film may be formed as a first layer, a silicon oxynitride film may be formed as a second layer, and a silicon nitride film may be formed as a third layer, and the microcrystalline semiconductor film may be formed over the silicon nitride film that is a top layer. In this case, the silicon nitride film or the silicon nitride oxide film in the first layer is preferably thicker than 50 nm and has an effect as a barrier which blocks impurities such as sodium, an effect of preventing a hillock of the gate electrode, an effect of preventing oxidation of the gate electrode, and the like. The silicon nitride film in the third layer has an effect of improving adherence of the microcrystalline semiconductor film and an effect of preventing oxidation in LP treatment in which the microcrystalline semiconductor film is irradiated with a laser beam.

When a nitride film such as a silicon nitride film which is very thin is formed over the surface of the gate insulating film in this manner, adherence of the microcrystalline semiconductor film can be improved. The nitride film may be formed by a plasma CVD method, or by nitridation treatment that is treatment with plasma which is generated by microwaves and has high density and low temperature. In addition, the silicon nitride film or the silicon nitride oxide film may also be formed when a reaction chamber is subjected to silane flush treatment.

Note that a silicon oxynitride film means a film that contains more oxygen than nitrogen and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, a silicon nitride oxide film means a film that contains more nitrogen than oxygen and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

The microcrystalline semiconductor film 53 is a film which contains a semiconductor having an intermediate structure between amorphous and crystalline structures (including a single crystal and a polycrystal). This semiconductor is a semiconductor which has a third state that is stable in terms of free energy, and is a crystalline semiconductor which has short-range order and lattice distortion, and column-like or needle-like crystals with a grain size, seen from the film surface, of 0.5 nm to 20 nm grown in the direction of a normal line with respect to the surface of the substrate. In addition, a microcrystalline semiconductor and an amorphous semiconductor are mixed. Microcrystalline silicon, which is a typical example of a microcrystalline semiconductor, has a Raman spectrum which is shifted to a lower wave number side than 521 cm$^{-1}$ that is a feature of single crystalline silicon. That is, the peak of a Raman spectrum of microcrystalline silicon is within the range from 480 cm$^{-1}$ (that is a feature of amorphous silicon) to 521 cm$^{-1}$ (that is a feature of single crystalline silicon). In addition, microcrystalline silicon is made to contain hydrogen or halogen of at least greater than or equal to 1 at. % for termination of dangling bonds. Moreover, microcrystalline silicon is made to contain a rare gas element such as helium, argon, krypton, or neon to further enhance its lattice distortion, whereby stability is increased and a favorable microcrystalline semiconductor film can be obtained. Such a microcrystalline semiconductor film is disclosed in, for example, U.S. Pat. No. 4,409,134.

The microcrystalline semiconductor film can be formed by a high-frequency plasma CVD method with a frequency of several tens of MHz to several hundreds of MHz or by use of a microwave plasma CVD apparatus with a frequency of greater than or equal to 1 GHz. The microcrystalline semiconductor film can be typically formed by a dilution of silicon hydride such as $SiH_4$, $Si_2H_6$, $SiH_2Cl_2$, $SiHCl_3$, $SiCl_4$, or $SiF_4$ with hydrogen. In addition, by a dilution with one or plural kinds of rare gas elements selected from helium, argon, krypton, and neon in addition to silicon hydride and hydrogen, the microcrystalline semiconductor film can be formed. In that case, the flow rate ratio of hydrogen to silicon hydride is set to be 5:1 to 200:1, preferably, 50:1 to 150:1, more preferably, 100:1.

The microcrystalline semiconductor film has low n-type conductivity when an impurity element for controlling valence electrons is not added thereto intentionally. Therefore, an impurity element imparting p-type conductivity may be added to the microcrystalline semiconductor film which functions as a channel formation region of a thin film transistor at the same time as or after formation of the microcrystalline semiconductor film, so that the threshold voltage can be controlled. A typical example of the impurity element imparting p-type conductivity is boron, and an impurity gas such as $B_2H_6$ or $BF_3$ may be added to silicon hydride at 1 ppm to 1000 ppm, preferably 1 ppm to 100 ppm. The concentration of boron is preferably set at $1 \times 10^{14}$ atoms/cm$^3$ to $6 \times 10^{16}$ atoms/cm$^3$.

In addition, the oxygen concentration of the microcrystalline semiconductor film is preferably set at less than or equal to $5 \times 10^{19}$ atoms/cm$^3$, more preferably, less than or equal to $1 \times 10^{19}$ atoms/cm$^3$, and each of the nitrogen concentration and the carbon concentration is preferably set at less than or equal to $1 \times 10^{18}$ atoms/cm$^3$. By decreases in concentrations of oxygen, nitrogen, and carbon to be mixed into the microcrystalline semiconductor film, the microcrystalline semiconductor film can be prevented from being changed into an n-type.

The microcrystalline semiconductor film 53 is formed with a thickness of greater than 0 nm and less than or equal to 50 nm, preferably, greater than 0 nm and less than or equal to 20 nm.

The microcrystalline semiconductor film 53 functions as a channel formation region of a thin film transistor to be formed later. When the thickness of the microcrystalline semiconductor film 53 is within the range described above, a thin film transistor to be formed later is to be a fully depleted type. In addition, because the microcrystalline semiconductor film contains microcrystals, it has a lower resistance than an amorphous semiconductor film. Therefore, a thin film transistor using the microcrystalline semiconductor film has current-voltage characteristics represented by a curve with a steep slope in a rising portion, has an excellent response as a switching element, and can be operated at high speed. With the use of the microcrystalline semiconductor film for a channel formation region of a thin film transistor, fluctuation of a threshold voltage of a thin film transistor can be suppressed. Therefore, a liquid crystal display device with less variation of electric characteristics can be manufactured.

The microcrystalline semiconductor film has higher mobility than an amorphous semiconductor film. Thus, with the use of a thin film transistor, a channel formation region of which is formed of the microcrystalline semiconductor film, for switching of a display element, the area of the channel formation region, that is, the area of the thin film transistor can be decreased. Accordingly, the area occupied by the thin film transistor in a single pixel is decreased, and an aperture ratio of the pixel can be increased. As a result of this, a liquid crystal display device with high resolution can be manufactured.

In addition, the microcrystalline semiconductor film has needle-like crystals which have grown longitudinally from the lower side. The microcrystalline semiconductor film has a mixed structure of amorphous and crystalline structures, and it is likely that a crack is generated and a gap is formed between the crystalline region and the amorphous region due to local stress. A new radical may be interposed into this gap and cause crystal growth. Because the upper crystal face is larger, a crystal is likely to grow upward into a needle shape. Even if the microcrystalline semiconductor film grows longitudinally as described above, the growth rate is a tenth to a hundredth of the film-formation rate of an amorphous semiconductor film.

The buffer layer 54 can be formed by a plasma CVD method using a silicon gas (a silicon hydride gas or a silicon halide gas) such as $SiH_4$, $Si_2H_6$, $SiH_2Cl_2$, $SiHCl_3$, $SiCl_4$, or $SiF_4$. Alternatively, by a dilution of silane mentioned above with one or plural kinds of rare gas elements selected from helium, argon, krypton, and neon, an amorphous semiconductor film can be formed. With the use of hydrogen at a flow rate which is 1 to 20 times, preferably, 1 to 10 times, more preferably, 1 to 5 times higher than that of silicon hydride, a hydrogen-containing amorphous semiconductor film can be formed. With the use of silicon hydride mentioned above and nitrogen or ammonia, a nitrogen-containing amorphous semiconductor film can be formed. With the use of silicon hydride mentioned above and a gas containing fluorine, chlorine, bromine, or iodine ($F_2$, $Cl_2$, $Br_2$, $I_2$, HF, HCl, HBr, HI, or the like), an amorphous semiconductor film containing fluorine, chlorine, bromine, or iodine can be formed.

Alternatively, as the buffer layer 54, an amorphous semiconductor film can be formed by sputtering with hydrogen or a rare gas using an amorphous semiconductor as a target. In this case, by inclusion of ammonia, nitrogen, or $N_2O$ in an atmosphere, a nitrogen-containing amorphous semiconductor film can be formed. Alternatively, by inclusion of a gas containing fluorine, chlorine, bromine, or iodine ($F_2$, $Cl_2$, $Br_2$, $I_2$, HF, HCl, HBr, HI, or the like) in an atmosphere, an amorphous semiconductor film containing fluorine, chlorine, bromine, or iodine can be formed.

Still alternatively, the buffer layer 54 may be formed by formation of an amorphous semiconductor film over the surface of the microcrystalline semiconductor film 53 by a plasma CVD method or a sputtering method and then by hydrogenation, nitridation, or halogenation of the surface of the amorphous semiconductor film through processing of the surface of the amorphous semiconductor film with hydrogen plasma, nitrogen plasma, halogen plasma, or plasma of a rare gas (helium, argon, krypton, or neon).

The buffer layer 54 is preferably formed using an amorphous semiconductor film. Therefore, when the buffer layer 54 is formed by a high-frequency plasma CVD method with a frequency of several tens of MHz to several hundreds of MHz or a microwave plasma CVD method, formation conditions are preferably controlled so that an amorphous semiconductor film can be obtained.

The buffer layer 54 is preferably formed with a thickness of 10 nm to 50 nm, inclusive. The total concentration of nitrogen, carbon, and oxygen contained in the buffer layer is preferably set at $1 \times 10^{20}$ atoms/cm$^3$ to $15 \times 10^{20}$ atoms/cm$^3$. With this concentration, also the buffer layer 54 having a thickness of 10 nm to 50 nm, inclusive can function as a high-resistance region.

Alternatively, the buffer layer 54 may be formed with a thickness of 150 nm to 200 nm, inclusive, and the concentration of each of carbon, nitrogen, and oxygen contained in the buffer layer 54 may be set at less than or equal to $3 \times 10^{19}$ atoms/cm$^3$, preferably, less than or equal to $5 \times 10^{18}$ atoms/cm$^3$.

By formation of an amorphous semiconductor film or an amorphous semiconductor film containing hydrogen, nitrogen, or halogen over the surface of the microcrystalline semiconductor film 53 as a buffer layer, the surfaces of crystal grains contained in the microcrystalline semiconductor film 53 can be prevented from being naturally oxidized. That is, by formation of the buffer layer over the surface of the microcrystalline semiconductor film 53, the microcrystal grains can be prevented from being oxidized. Since the buffer layer includes hydrogen and/or fluorine, oxygen can be prevented from entering the microcrystalline semiconductor film.

The buffer layer 54 is formed using an amorphous semiconductor film or an amorphous semiconductor film containing hydrogen, nitrogen, or halogen, so that the buffer layer 54 has higher resistance than the microcrystalline semiconductor film which functions as a channel formation region. Therefore, in a thin film transistor to be formed later, the buffer layer formed between source and drain regions and the microcrystalline semiconductor film functions as a high-resistance region. Accordingly, the off current of the thin film transistor can be reduced. When the thin film transistor is used as a switching element of a liquid crystal display device, the contrast of the liquid crystal display device can be improved.

Figure 2C:
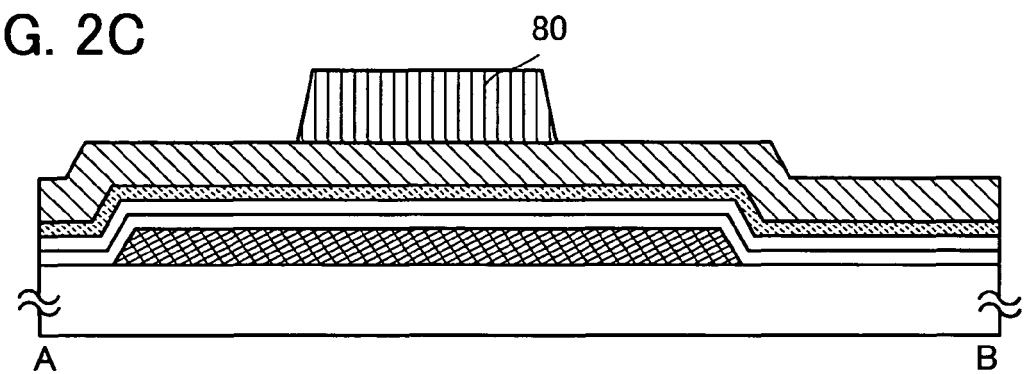

Next, the channel protective layer 80 is formed over the buffer layer 54 so as to overlap with the channel formation region of the microcrystalline semiconductor film 53 (FIG. 2C). The channel protective layer 80 may also be formed successively after the gate insulating films 52a and 52b, the microcrystalline semiconductor film 53, and the buffer layer 54 are formed, without being exposed to the atmosphere. When the thin films that are stacked are formed successively without exposing the substrate to the atmosphere, the productivity can be improved.

The channel protective layer 80 can be formed using an inorganic material (such as silicon oxide, silicon nitride, silicon oxynitride, or silicon nitride oxide). A photosensitive or non-photosensitive organic material (organic resin material, e.g., polyimide, acrylic, polyamide, polyimideamide, resist, or benzocyclobutene), a film made of plural kinds of these materials, or a stacked film of them may also be used. Alternatively, siloxane may be used. As a manufacturing method of the channel protective layer 80, a vapor deposition method such as a plasma CVD method or a thermal CVD method, or a sputtering method can be used. A coating method such as a spin coating method or a droplet discharging method which is a wet method, a printing method (such as screen printing or offset printing by which a pattern is formed), or the like can also be used. The channel protective layer 80 may be formed and then patterned by etching, or may be formed as selected by a droplet discharging method.

Figure 2D:
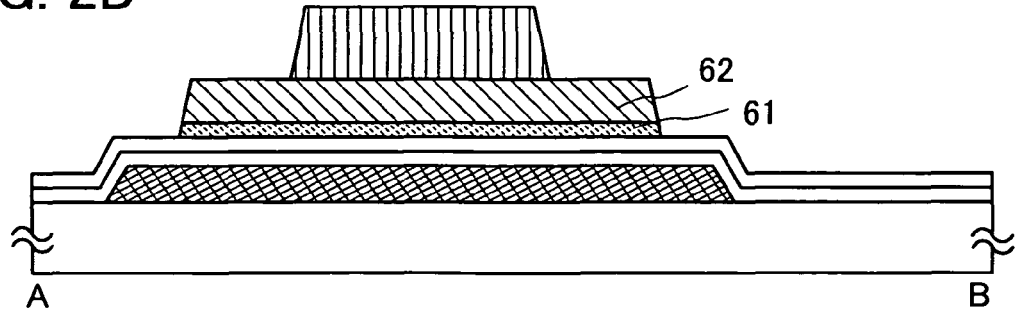

Next, the microcrystalline semiconductor film 53 and the buffer layer 54 are patterned by etching, and a stack of the microcrystalline semiconductor film 61 and the buffer layer 62 is formed (FIG. 2D). The microcrystalline semiconductor film 61 and the buffer layer 62 can be formed by forming a mask by a photolithography technique or a droplet discharging method and etching the microcrystalline semiconductor film 53 and the buffer layer 54 using the mask. FIG. 2D is a cross-sectional view of a cross section taken along a line A-B in FIG. 4B.

The end portions of the microcrystalline semiconductor film 61 and the buffer layer 62 can be etched to have a tapered shape. The taper angle of the end portions is 30° to 90°, preferably 45° to 80°. Thus, disconnection of a wiring due to a step shape can be prevented.

Figure 3A:
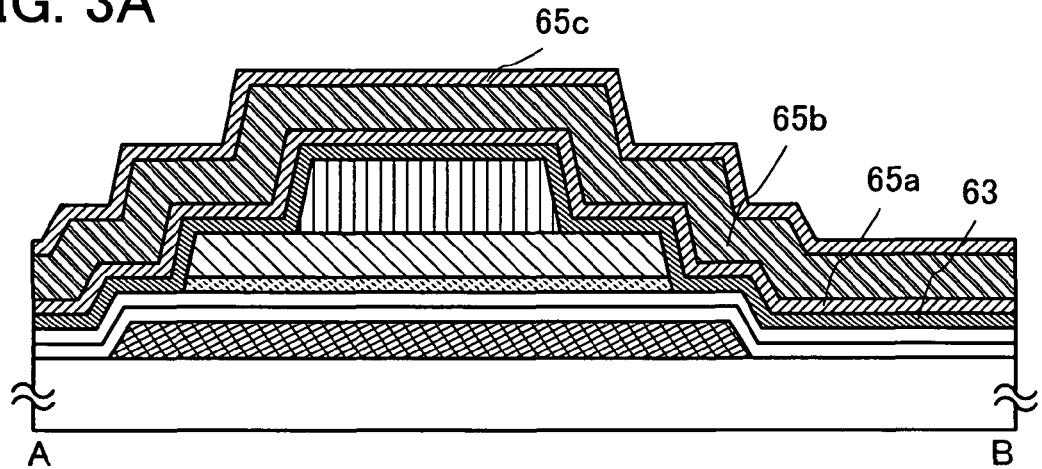
FIGS. 3A to 3C show a method for manufacturing a liquid crystal display device of the present invention.

Next, a semiconductor film 63 to which an impurity element imparting one conductivity type is added (hereinafter, the semiconductor film 63) and conductive films 65a to 65c are formed over the gate insulating film 52b, the microcrystalline semiconductor film 61, the buffer layer 62, and the channel protective layer 80 (FIG. 3A). A mask 66 is formed over the semiconductor film 63 and the conductive films 65a to 65c. The mask 66 is formed by a photolithography technique or an ink-jet method.

In the case where an n-channel thin film transistor is formed using the semiconductor film 63, phosphorus may be added as a typical impurity element to the semiconductor film 63, and an impurity gas such as $PH_3$ may be added to silicon hydride. In addition, when a p-channel thin film transistor is formed, boron may be added as a typical impurity element, and an impurity gas such as $B_2H_6$ may be added to silicon hydride. The semiconductor film 63 can be formed using a microcrystalline semiconductor film or an amorphous semiconductor film and may have a thickness of from 2 nm to 50 nm (preferably, from 10 nm to 30 nm).

It is preferable that the conductive film be formed using a single layer or a stacked layer of aluminum, copper, or an aluminum alloy to which an element to improve resistance to heat or an element which prevents a hillock such as silicon, titanium, neodymium, scandium, or molybdenum is added. Alternatively, the conductive film may have a layered structure in which a film on the side in contact with the semiconductor film to which an impurity imparting one conductivity type is added is formed of titanium, tantalum, molybdenum, tungsten, or a nitride of any of these elements and an aluminum film or an aluminum alloy film is formed thereover. Still alternatively, the conductive film may have a layered structure in which an aluminum film or an aluminum alloy film is sandwiched between upper and lower films of titanium, tantalum, molybdenum, tungsten, or a nitride of any of these elements. Here, as the conductive film, a conductive film with a three-layer structure in which the conductive films 65a to 65c are stacked is described. A layered conductive film in which molybdenum films are used as the conductive films 65a and 65c and an aluminum film is used as the conductive film 65b, or a layered conductive film in which titanium films are used as the conductive films 65a and 65c and an aluminum film is used as the conductive film 65b can be given.

The conductive films 65a to 65c are formed by a sputtering method or a vacuum evaporation method. Alternatively, the conductive films 65a to 65c may be formed by discharging a conductive nanopaste of silver, gold, copper, or the like by a screen printing method, an ink-jet method, or the like and baking it.

Figure 3B:
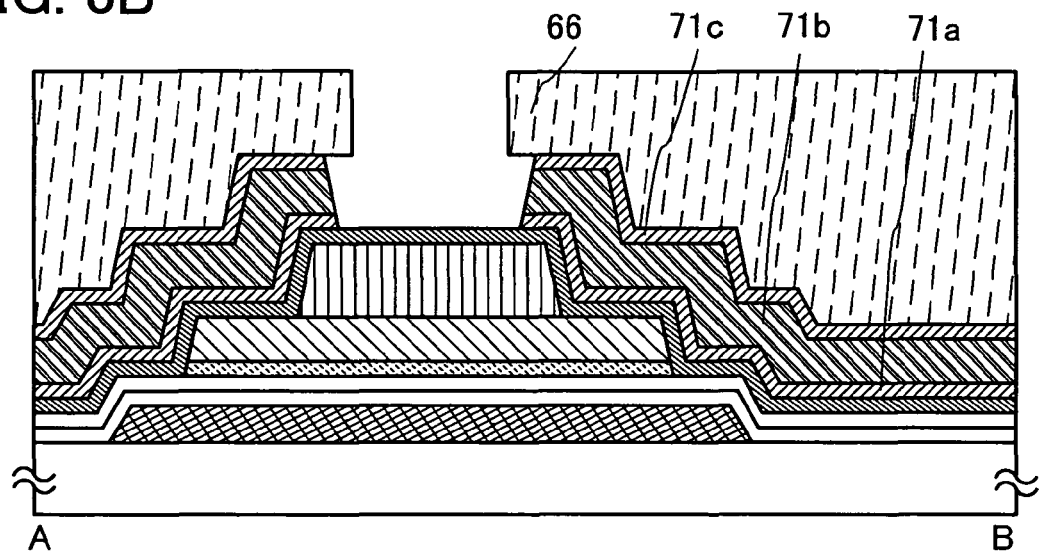
Figure 3C:
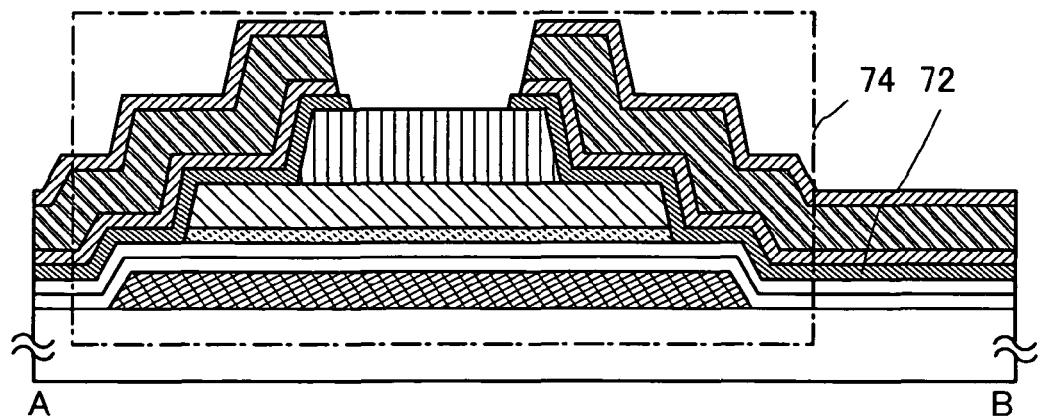

Next, the conductive films 65a to 65c are etched using the mask 66 to form source and drain electrodes 71a to 71c (FIG. 3B). When the conductive films 65a to 65c are subjected to wet etching as in this embodiment mode as shown in FIG. 3B, the conductive films 65a to 65c are isotropically etched. Thus, end portions of the mask 66 and end portions of the source and drain electrodes 71a to 71c are not aligned, and the end portions of the source and drain electrodes 71a to 71c further recede. After that, the semiconductor film 63 is etched using the mask 66 to form source and drain regions 72 (FIG. 3C). Note that the buffer layer 62 is not etched because the channel protective layer 80 functions as a channel stopper.

Figure 4C:
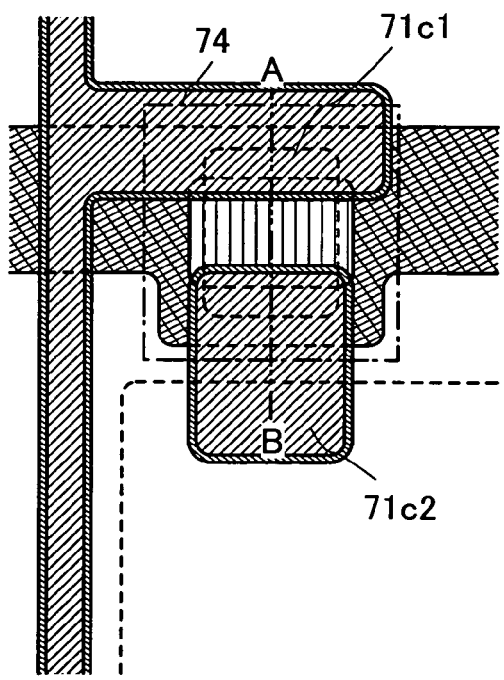
Figure 4D:
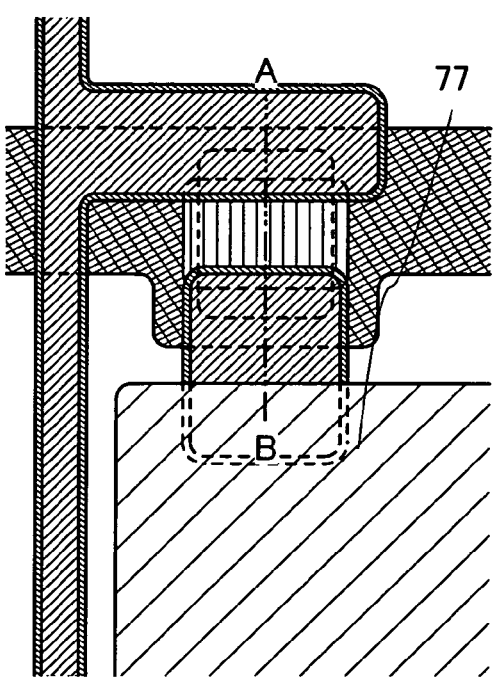

The end portions of the source and drain electrodes 71a to 71c are not aligned with the end portions of the source and drain regions 72, and the end portions of the source and drain regions 72 are formed outside of the end portions of the source and drain electrodes 71a to 71c. After that, the mask 66 is removed. Note that FIG. 3C is a cross-sectional view of a cross section taken along a line A-B in FIG. 4C. As shown in FIG. 4C, it can be seen that the end portions of the source and drain regions 72 are positioned outside of the end portions of the source and drain electrodes 71c. In other words, it can be seen that an area of the source and drain regions 72 is larger than that of the source and drain electrodes 71a to 71c. One of the source and drain electrodes also functions as a source or drain wiring.

With such a shape as shown in FIG. 3C in which the end portions of the source and drain electrodes 71a to 71c are not aligned with the end portions of the source and drain regions 72, the end portions of the source and drain electrodes 71a to 71c are more apart from each other; therefore, leakage current and short circuit between the source and drain electrodes can be prevented. In other words, it can be seen that the source and drain regions extend beyond edges of the source and drain electrodes, and a distance between edges of the source and drain regions facing each other is shorter than a distance between the edges of the source and drain electrodes facing each other. Accordingly, a thin film transistor with high reliability and high resistance to voltage can be manufactured.

Through the above-described process, the channel stop (protective) type thin film transistor 74 can be formed.

The buffer layer 62 below the source and drain regions 72 and the buffer layer 62 over the channel formation region of the microcrystalline semiconductor film 61 are a continuous film formed using the same material at the same time. The buffer layer 62 over the microcrystalline semiconductor film 61 blocks external air and an etching residue with hydrogen included therein and protects the microcrystalline semiconductor film 61.

The buffer layer 62 which does not include an impurity element imparting one conductivity type is provided, whereby an impurity element imparting one conductivity type, which is included in the source and drain regions, and an impurity element imparting one conductivity type, which is used for controlling threshold voltage of the microcrystalline semiconductor film 61, can be prevented from being mixed to each other. When impurity elements imparting one conductivity type are mixed with each other, a recombination center is generated, which leads to flow of leakage current and loss of the effect of reducing off current.

By provision of the buffer layer and the channel protective layer as described above, a channel stop type thin film transistor with high resistance to voltage, in which leakage current is reduced, can be manufactured. Accordingly, the thin film transistor has high reliability and can be suitably used for a liquid crystal display device to which a voltage of 15 V is applied.

Next, the pixel electrode 77 is formed so as to be in contact with the source or drain electrode 71c. The insulating film 76 is formed over the source and drain electrodes 71a to 71c, the source and drain regions 72, the channel protective layer 80, the gate insulating film 52b, and the pixel electrode 77. The insulating film 76 can be formed in a manner similar to the gate insulating films 52a and 52b. Note that the insulating film 76 prevents intrusion of a contaminating impurity such as an organic matter, a metal, or water vapor contained in the atmosphere; thus, a dense film is preferably used for the insulating film 76.

The buffer layer 62 is preferably formed with a thickness of 10 nm to 50 nm, inclusive. The buffer layer 62 over the channel formation region of the microcrystalline semiconductor film 61 is not etched, so that the buffer layer 62 is not needed to be formed thickly and film-formation time can be shortened. In addition, the total concentration of nitrogen, carbon, and oxygen contained in the buffer layer is preferably set at $1\times10^{20}$ atoms/cm$^3$ to $15\times10^{20}$ atoms/cm$^3$. With the above concentration, also the buffer layer 62 having a thickness of 10 nm to 50 nm, inclusive, can function as a high-resistance region.

Alternatively, the buffer layer 62 may be formed with a thickness of 150 nm to 200 nm, inclusive, and the concentration of carbon, nitrogen, and oxygen contained in the buffer layer 62 may be set at less than or equal to $3\times10^{19}$ atoms/cm$^3$, preferably, less than or equal to $5\times10^{18}$ atoms/cm$^3$. In this case, when the insulating film 76 is formed of a silicon nitride film, the oxygen concentration in the buffer layer 62 can be set at less than or equal to $5\times10^{19}$ atoms/cm$^3$, preferably, less than or equal to $1\times10^{19}$ atoms/cm$^3$.

Next, the insulating film 76 is etched so that part of the pixel electrode 77 is exposed. A liquid crystal element is formed to be in contact with an exposed region of the pixel electrode 77, so that the thin film transistor 74 and the liquid crystal element can be electrically connected to each other. For example, an alignment film is formed over the pixel electrode 77, a counter electrode provided with another alignment film is made to face the alignment film over the pixel electrode 77, and a liquid crystal layer is formed between the alignment films.

For the pixel electrode 77, a conductive material having a light-transmitting property, such as indium oxide which contains tungsten oxide, indium zinc oxide which contains tungsten oxide, indium oxide which contains titanium oxide, indium tin oxide which contains titanium oxide, indium tin oxide (hereinafter ITO), indium zinc oxide, or indium tin oxide to which silicon oxide has been added can be used.

The pixel electrode 77 can be formed using a conductive composition containing a conductive high-molecular compound (also referred to as a conductive polymer). It is preferable that the pixel electrode formed using the conductive composition have a sheet resistance of less than or equal to 10000 Ω/square and a light transmittance of greater than or equal to 70% at a wavelength of 550 nm. In addition, it is preferable that the resistivity of the conductive high-molecular compound contained in the conductive composition be less than or equal to 0.1Ω·cm.

As a conductive high-molecular compound, a so-called π electron conjugated conductive high-molecular compound can be used. For example, polyaniline or a derivative thereof, polypyrrole or a derivative thereof, polythiophene or a derivative thereof, and a copolymer of two or more kinds of them can be given.

Figure 26:
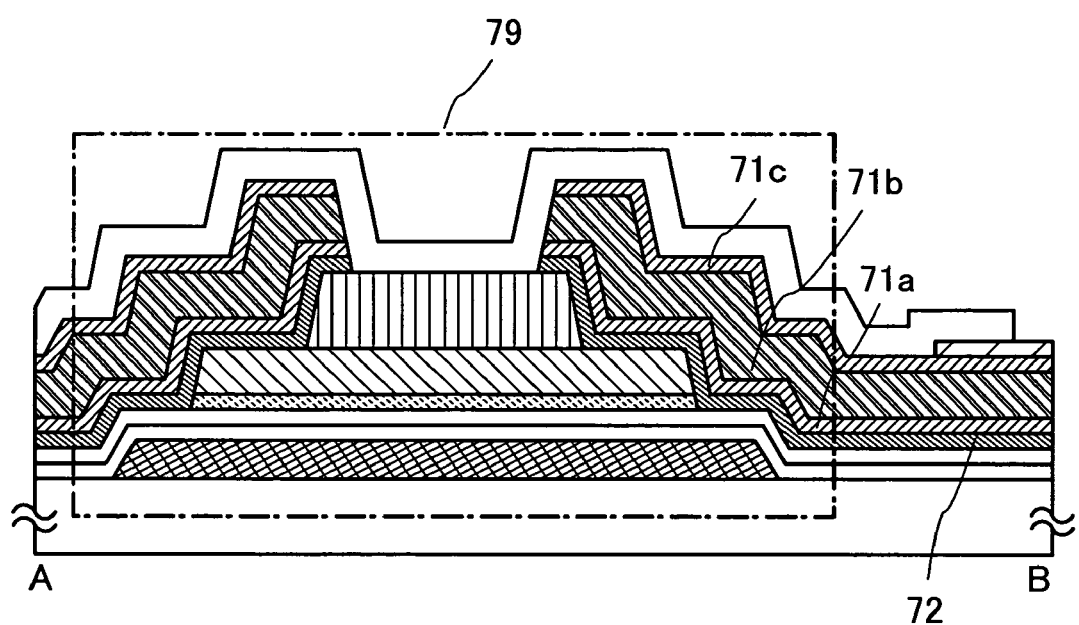
FIG. 26 is an explanatory view of a liquid crystal display device of the present invention.

The end portions of the source and drain regions and the end portions of the source and drain electrodes may be aligned with each other. FIG. 26 shows a thin film transistor 79 of a channel stop type in which the end portions of the source and drain regions and the end portions of the source and drain electrodes are aligned with each other. When the source and drain electrodes and the source and drain regions are subjected to dry etching, a shape like the thin film transistor 79 can be obtained. Alternatively, also when the semiconductor film to which an impurity element imparting one conductivity type is added is etched using the source and drain electrodes as a mask to form the source and drain regions, a shape like the thin film transistor 79 can be obtained.

When the thin film transistor is formed as a channel stop type thin film transistor, reliability of the thin film transistor can be improved. By formation of a channel formation region with a microcrystalline semiconductor film, a field-effect mobility of 1 $cm^2/V\cdot sec$ to 20 $cm^2/V\cdot sec$ can be achieved. Accordingly, this thin film transistor can be used as a switching element of a pixel in a pixel portion and as an element included in a scanning line (gate line) driver circuit.

According to this embodiment mode, a liquid crystal display device including a thin film transistor with high electric characteristics and high reliability can be manufactured.

Embodiment Mode 2

This embodiment mode will describe an example of a thin film transistor whose shape is different from that of Embodiment Mode 1. Except the shape, the thin film transistor can be formed in a similar manner to Embodiment Mode 1; thus, repetitive description of the same components or components having similar functions as in Embodiment Mode 1 and manufacturing steps for forming those components will be omitted.

Figure 5:
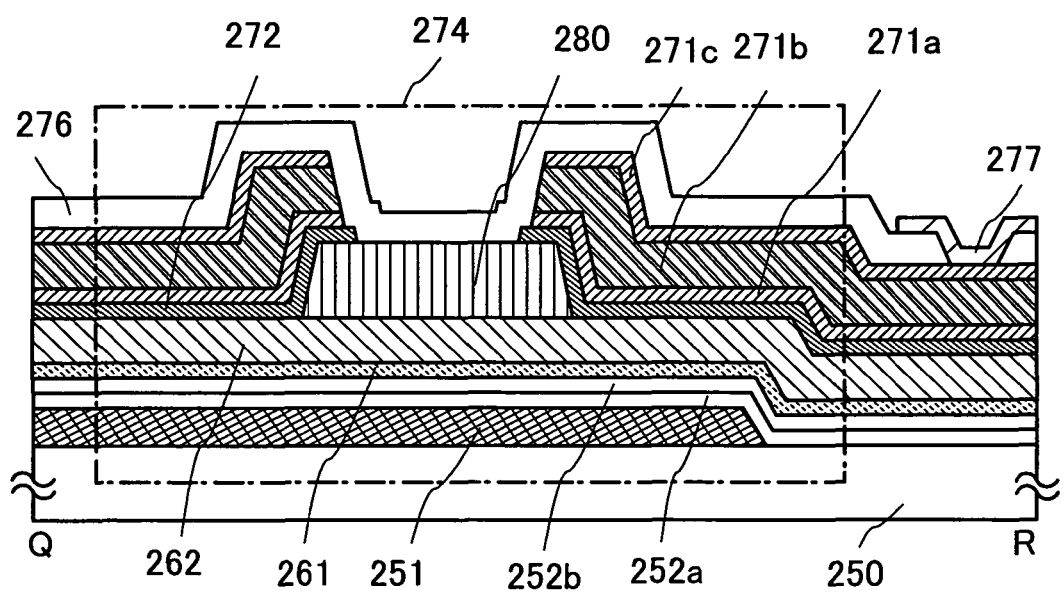
FIG. 5 is an explanatory view of a liquid crystal display device of the present invention.
Figure 27:
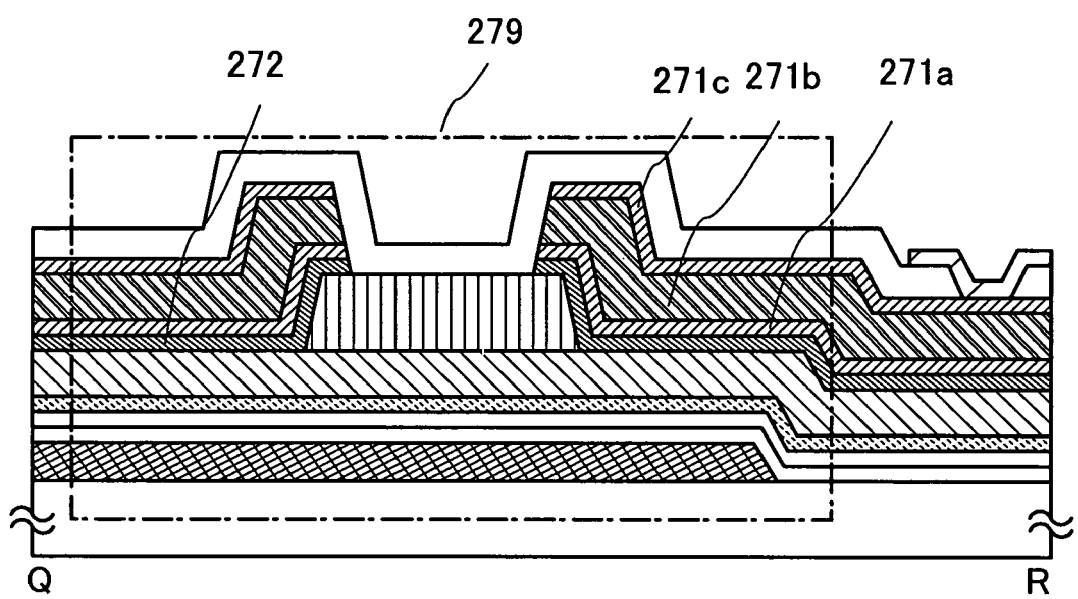
FIG. 27 is an explanatory view of a liquid crystal display device of the present invention.

This embodiment mode will describe a thin film transistor which is used for a liquid crystal display device and a manufacturing process of the thin film transistor with reference to FIG. 5, FIGS. 6A to 6D, and FIG. 27. FIG. 5 and FIG. 27 are cross-sectional views showing a thin film transistor and a pixel electrode, and FIGS. 6A to 6D are plane views showing a region in a pixel where the thin film transistor and the pixel electrode are connected to each other. FIG. 5 and FIG. 27 are cross-sectional views showing the thin film transistor in a cross section taken along a line Q-R in FIGS. 6A to 6D, and a manufacturing process thereof.

FIG. 5 and FIGS. 6A to 6D show a bottom gate thin film transistor 274 of a channel stop type (also referred to as a channel protective type) of this embodiment mode.

In FIG. 5, the channel stop type thin film transistor 274 is provided over a substrate 250. The channel stop thin film transistor 274 includes a gate electrode 251, gate insulating films 252a and 252b, a microcrystalline semiconductor film 261, a buffer layer 262, a channel protective layer 280, source and drain regions 272, and source and drain electrodes 271a, 271b, and 271c. An insulating film 276 is provided so as to cover the thin film transistor 274. A pixel electrode 277 is provided so as to be in contact with the source or drain electrode 271c in a contact hole formed in the insulating film 276. Note that FIG. 5 corresponds to FIG. 6D.

The channel protective layer 280 is provided over a channel formation region of the microcrystalline semiconductor film 261 with the buffer layer 262 interposed therebetween. Thus, damage which is caused in the manufacturing process to the buffer layer 262 over the channel formation region of the microcrystalline semiconductor film 261 (such as reduction in film thickness due to radicals in plasma or an etching agent in etching, or oxidation) can be prevented. Therefore, reliability of the thin film transistor 274 can be improved. The buffer layer 262 over the channel formation region of the microcrystalline semiconductor film 261 is not etched, so that the buffer layer 262 is not needed to be formed thickly and film-formation time can be shortened.

Figure 6A:
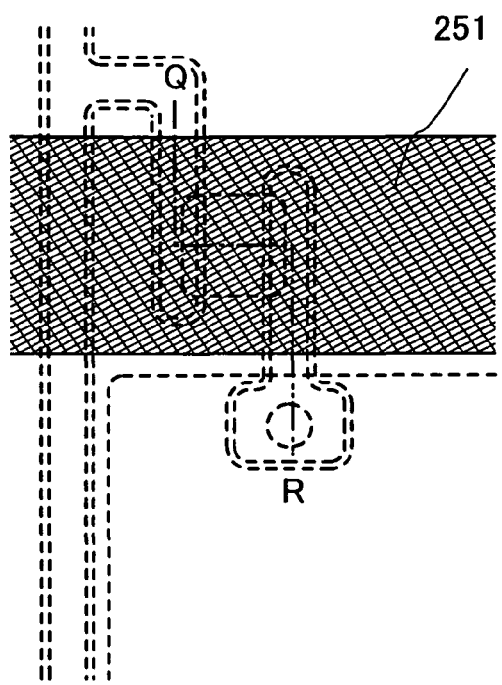
FIGS. 6A to 6D show a method for manufacturing a liquid crystal display device of the present invention.
Figure 6B:
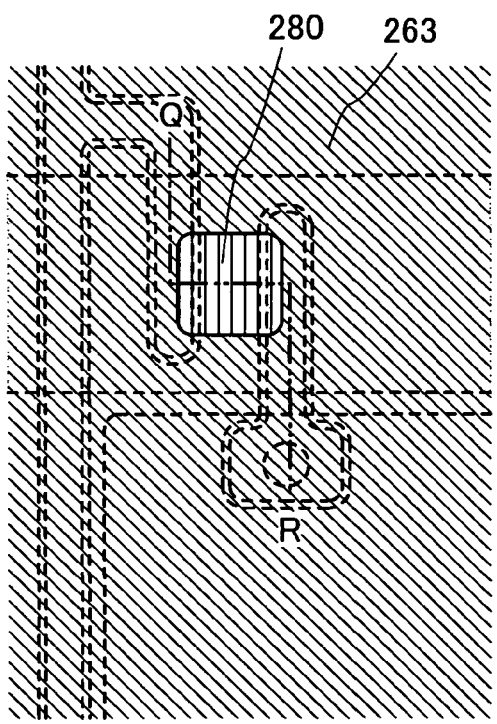

Hereinafter, a manufacturing method will be described with reference to FIGS. 6A to 6D. The gate electrode 251 is formed over the substrate 250 (FIG. 6A). The gate insulating films 252a and 252b are formed over the gate electrode 251, and the microcrystalline semiconductor film 261 and the buffer layer 262 are formed thereover. Over the buffer layer 262, the channel protective layer 280 is formed so as to overlap with the channel formation region of the microcrystalline semiconductor film (FIG. 6B).

Embodiment Mode 1 shows an example in which, after formation of the channel protective layer 80, the microcrystalline semiconductor film 53 and the buffer layer 54 are processed into the island-shaped microcrystalline semiconductor film 61 and the island-shaped buffer layer 62, respectively, by etching. However, this embodiment mode shows an example in which the microcrystalline semiconductor film and the buffer layer are etched at the same time when a conductive film to be the source and drain electrodes and a semiconductor film to which an impurity element imparting one conductivity type is added are etched. Therefore, the microcrystalline semiconductor film, the buffer layer, the semiconductor film to which an impurity element imparting one conductivity type is added, and the conductive film to be the source and drain electrodes are etched using the same mask. When the microcrystalline semiconductor film, the buffer layer, the semiconductor film to which an impurity element imparting one conductivity type is added, and the conductive film to be the source and drain electrodes are etched by one etching process, the manufacturing process can be simplified, and the number of masks used in the etching process can be reduced.

Figure 6C:
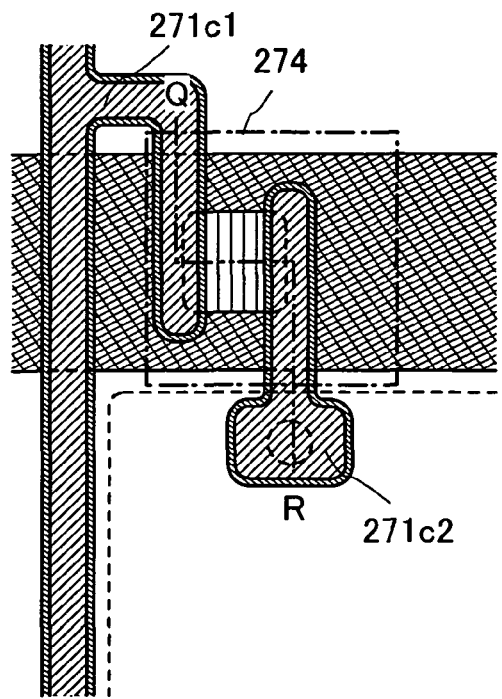
Figure 6D:
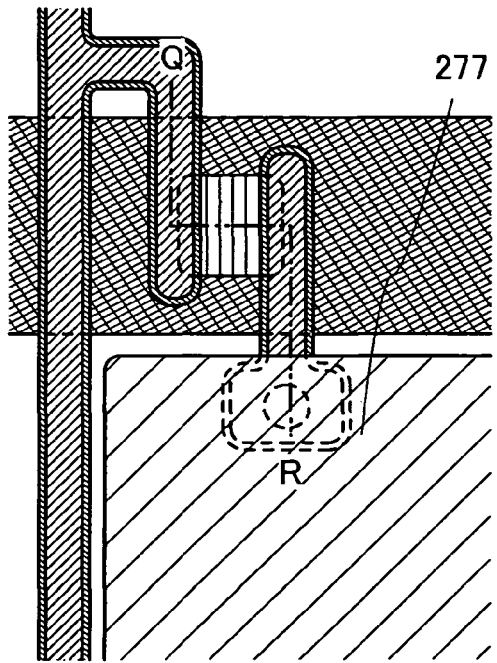

The microcrystalline semiconductor film, the buffer layer, the semiconductor film to which an impurity element imparting one conductivity type is added, and the conductive film are etched, so that the microcrystalline semiconductor film 261, the buffer layer 262, the source and drain regions 272, and the source and drain electrodes 271a to 271c are formed. In this manner, the channel stop type thin film transistor 274 is formed (FIG. 6C). The insulating film 276 is formed so as to cover the thin film transistor 274, and the contact hole which exposes the source or drain electrode 271c is formed. The pixel electrode 277 is formed in the contact hole, so that the thin film transistor 274 and the pixel electrode 277 are electrically connected to each other (FIG. 6D).

The end portions of the source and drain regions and the end portions of the source and drain electrodes may be aligned with each other. FIG. 27 shows a thin film transistor 279 of a channel stop type in which the end portions of the source and drain regions and the end portions of the source and drain electrodes are aligned with each other. When the source and drain electrodes and the source and drain regions are subjected to dry etching, a shape like the thin film transistor 279 can be obtained. Alternatively, also when the semiconductor film to which an impurity element imparting one conductivity type is added is etched using the source and drain electrodes as a mask to form the source and drain regions, a shape like the thin film transistor 279 can be obtained.

When the thin film transistor is formed as a channel stop type thin film transistor, reliability of the thin film transistor can be improved. By formation of a channel formation region with a microcrystalline semiconductor film, a field-effect mobility of 1 $cm^2/V\cdot sec$ to 20 $cm^2/V\cdot sec$ can be achieved. Accordingly, this thin film transistor can be used as a switching element of a pixel in a pixel portion and as an element included in a scanning line (gate line) driver circuit.

According to this embodiment mode, a liquid crystal display device including a thin film transistor with high electric characteristics and high reliability can be manufactured.

Embodiment Mode 3

This embodiment mode will describe an example of a manufacturing process in which a microcrystalline semiconductor film is irradiated with a laser beam.

A gate electrode is formed over a substrate, and a gate insulating film is formed so as to cover the gate electrode. Then, a microcrystalline silicon (SAS) film is formed as a microcrystalline semiconductor film over the gate insulating film. The thickness of the microcrystalline semiconductor film is greater than or equal to 1 nm and less than 15 nm, preferably 2 nm to 10 nm, inclusive. In particular, the microcrystalline semiconductor film with a thickness of 5 nm (4 nm to 8 nm) has high absorptance of a laser beam and improves productivity.

In the case where the microcrystalline semiconductor film is formed over the gate insulating film by a plasma CVD method or the like, near the interface between the gate insulating film and a semiconductor film which contains crystals, a region which contains more amorphous components than the semiconductor film which contains crystals (here such a region is referred to as an interface region) is formed in some cases. In addition, in the case where an ultra-thin microcrystalline semiconductor film with a thickness of about less than or equal to 10 nm is formed by a plasma CVD method or the like, although a semiconductor film which contains microcrystal grains can be formed, it is difficult to obtain a semiconductor film which contains microcrystal grains which has high quality uniformly throughout the film. In these cases, a laser process of irradiation with a laser beam to be described below is effective.

Next, the surface of the microcrystalline silicon film is irradiated with a laser beam having such an energy density that the microcrystalline silicon film is not melted. This laser process (hereinafter also referred to as "LP") of this embodiment mode involves solid-phase crystal growth which is performed by radiation heating without the microcrystalline silicon film being melted. That is, the process utilizes a critical region where a deposited semi-amorphous silicon film is not brought into a liquid phase, and in that sense, the process can also be referred to as "critical growth".

The laser beam can affect a region to the interface between the microcrystalline silicon film and the gate insulating film. Accordingly, using the crystals on the surface side of the microcrystalline silicon film as nuclei, solid-phase crystal growth advances from the surface toward the interface with the gate insulating film, and roughly column-like crystals grow. The solid-phase crystal growth by the LP process is not to increase the size of crystal grains but rather to improve crystallinity in a film thickness direction.

In the LP process, for example, a microcrystalline silicon film over a glass substrate of 730 mm×920 mm can be processed by a single laser beam scan, by collecting a laser beam into a long rectangular shape (a linear laser beam). In this case, the proportion of overlap of linear laser beams (the overlap rate) is set to be 0% to 90% (preferably, 0% to 67%). Accordingly, processing time for each substrate can be shortened, and the productivity can be increased. The shape of the laser beam is not limited to a linear shape, and similar processing can be conducted using a planar laser beam. In addition, the LP process of this embodiment mode is not limited to be used for the glass substrate of the above size and can be used for substrates of various sizes.

The LP process has effects in improving crystallinity of an interface region with the gate insulating film and improving electric characteristics of a thin film transistor having a bottom gate structure like the thin film transistor of this embodiment mode.

In such critical growth, there is also a feature in that unevenness (a projecting body called a ridge), which is observed on the surface of conventional low-temperature polysilicon, is not formed and the smoothness of silicon surface is maintained after the LP process.

A crystalline silicon film which is obtained by the action of the laser beam directly on the microcrystalline silicon film after the formation as in this embodiment mode is distinctly different in growth mechanism and film quality from a conventional microcrystalline silicon film which is obtained by being just deposited and a microcrystalline silicon film which is modified by conduction heating (the one disclosed in Reference 1). In this specification, a crystalline semiconductor film which is obtained through LP process performed to a microcrystalline semiconductor film after the formation is referred to as an LPSAS film.

After the microcrystalline semiconductor film such as an LPSAS film is formed, an amorphous silicon (a-Si:H) film is formed as a buffer layer by a plasma CVD method at 300° C. to 400° C. By formation of the amorphous silicon film, hydrogen is supplied to the LPSAS film, and the same effect as in the case of hydrogenation of the LPSAS film can be achieved. In other words, by formation of the amorphous silicon film over the LPSAS film, hydrogen is diffused into the LPSAS film, so that a dangling bond can be terminated.

Subsequent manufacturing steps are similar to those in Embodiment Mode 1. A channel protective layer is formed, and a mask is formed thereover. Next, the microcrystalline semiconductor film and the buffer layer are etched using the mask. Then, a semiconductor film to which an impurity element imparting one conductivity type is added and a conductive film are formed, and a mask is formed over the conductive film. The conductive film is etched using the mask, so that source and drain electrodes are formed. Further, using the same mask, the semiconductor film to which an impurity element imparting one conductivity type is added is etched using the channel protective layer as an etching stopper, so that source and drain regions are formed.

Through the above process, a channel stop type thin film transistor can be formed, and a liquid crystal display device including the channel stop type thin film transistor can be manufactured.

This embodiment mode can be freely combined with Embodiment Mode 1 or 2.

Embodiment Mode 4

This embodiment mode will describe an example of a manufacturing process of a liquid crystal display device in Embodiment Modes 1 to 3 in detail. Therefore, repetitive description of the same components or components having similar functions as in Embodiment Modes 1 to 3 and manufacturing steps for forming those components will be omitted.

In Embodiment Modes 1 to 3, before the microcrystalline semiconductor film is formed, a reaction chamber may be subjected to cleaning and flush (washing) treatment (hydrogen flush using hydrogen as a flush substance, silane flush using silane as a flush substance, or the like). By the flush treatment, a film to be formed can be prevented from being contaminated by an impurity such as oxygen, nitrogen, or fluorine in a reaction chamber.

By the flush treatment, an impurity element such as oxygen, nitrogen, or fluorine in a reaction chamber can be removed. For example, silane flush treatment is performed in the following manner: a plasma CVD apparatus is used, and monosilane is used as a flush substance and introduced to a chamber at a gas flow rate of 8 SLM to 10 SLM for 5 to 20 minutes, preferably 10 to 15 minutes. Note that 1 SLM is 1000 sccm, that is, 0.06 m$^3$/h.

The cleaning can be performed with the use of, for example, fluorine radicals. Note that a reaction chamber can be cleaned with the use of fluorine radicals in the following manner: carbon fluoride, nitrogen fluoride, or fluorine is introduced to a plasma generator provided outside the reaction chamber and the gas is dissociated, and the fluorine radials are introduced to the reaction chamber.

The flush treatment may also be performed before the gate insulating film, the buffer layer, the channel protective layer, and the semiconductor film to which an impurity element imparting one conductivity type is added are formed. Note that the flush treatment is effective when it is performed after cleaning.

Before a substrate is carried into a reaction chamber to perform film formation, the inner wall of each reaction chamber may be coated with a protective film that is a film to be formed (this coating is also referred to as pre-coating treatment). Pre-coating treatment is treatment in which plasma treatment is performed by flowing of a deposition gas in a reaction chamber to coat the inner wall of the reaction chamber with a thin protective film in advance. For example, before a microcrystalline silicon film is formed as the microcrystalline semiconductor film, pre-coating treatment may be performed in which the inner wall of the reaction chamber is coated with an amorphous silicon film with a thickness of 0.2 μm to 0.4 μm. Flush treatment may be performed after pre-coating treatment (hydrogen flush, silane flush, or the like). In the case of performing cleaning and pre-coating treatment, it is necessary that a substrate be carried out from a reaction chamber. However, in the case of performing flush treatment (hydrogen flush, silane flush, or the like), a substrate may be in a reaction chamber because plasma treatment is not performed.

A protective film formed of an amorphous silicon film is formed on the inner wall of a reaction chamber in which a microcrystalline silicon film is formed, and hydrogen plasma treatment is performed before film formation. In this case, the protective film is etched and an extremely small amount of silicon is deposited on a substrate. The silicon can be a nucleus of crystal growth.

By the pre-coating treatment, a film to be formed can be prevented from being contaminated by an impurity such as oxygen, nitrogen, or fluorine in a reaction chamber.

The pre-coating treatment may be performed before formation of a gate insulating film and a semiconductor film to which an impurity element imparting one conductivity type is added.

An example of a method for forming a gate insulating film, a microcrystalline semiconductor film, and a buffer layer is described in detail.

Figure 10A:
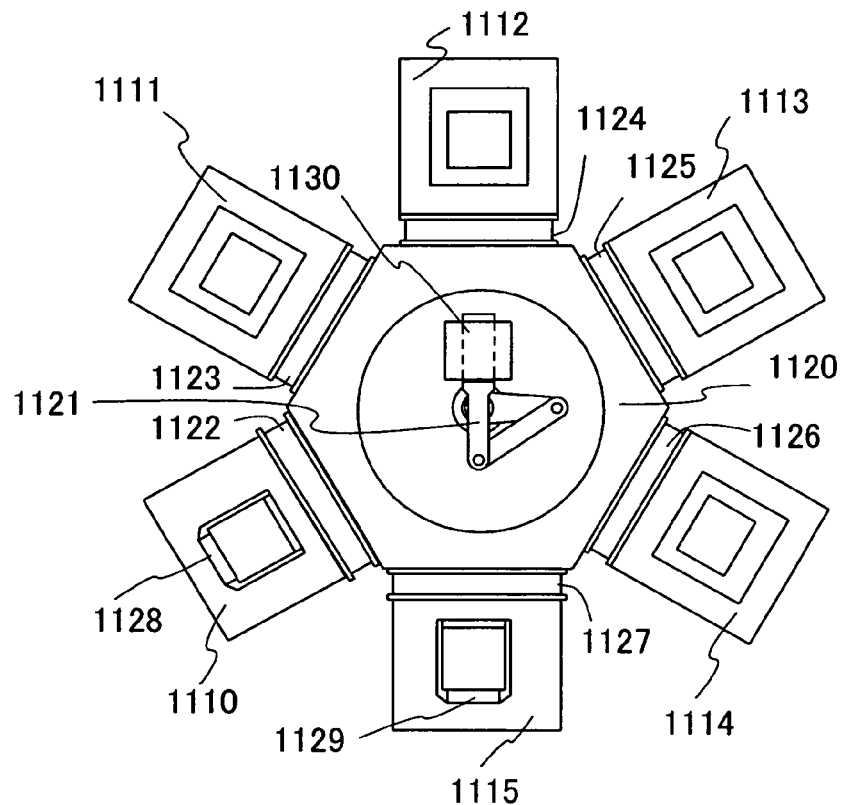
FIGS. 10A and 10B are plane views showing a plasma CVD apparatus of the present invention.
Figure 10B:
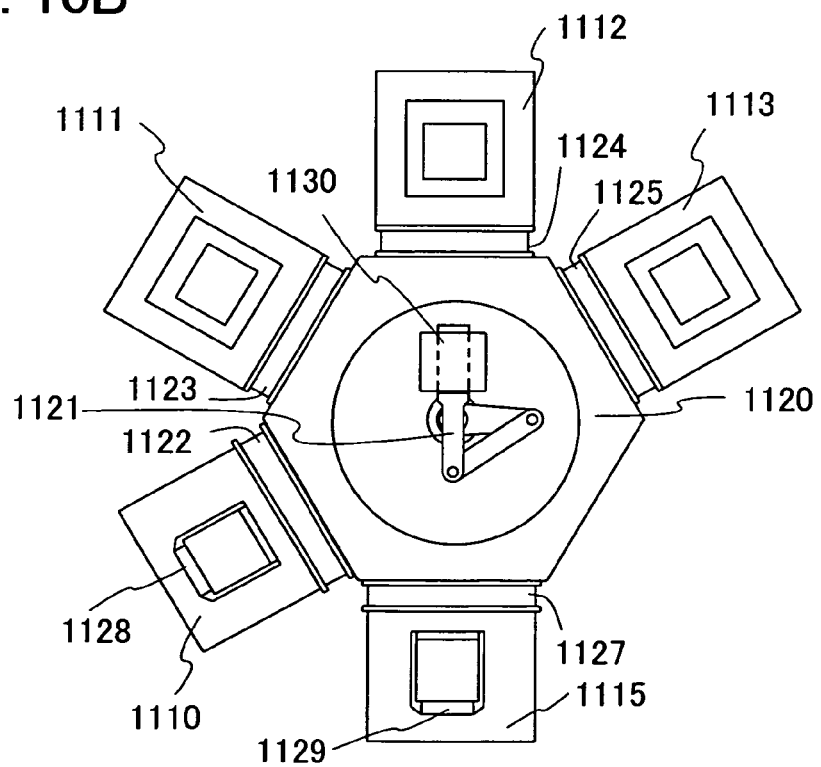

FIGS. 10A and 10B each show an example of a plasma CVD apparatus which can be used for the present invention. FIGS. 10A and 10B each show a microwave plasma CVD apparatus which can perform successive film formation. FIGS. 10A and 10B are plane views each schematically showing a microwave plasma CVD apparatus. A loading chamber 1110, an unloading chamber 1115, and reaction chambers (1) 1111 to (4) 1114 are provided around a common chamber 1120. Gate valves 1122 to 1127 are provided between the common chamber 1120 and each chamber so that treatment in each chamber does not have influence on treatment in other chambers. Note that the number of reaction chambers is not limited to four, and the number of reaction chambers may be more than four or less than four. When the number of reaction chambers is large, reaction chambers can be allocated according to a kind of a film to be formed; thus, the number of cleaning of the reaction chamber can be reduced. FIG. 10A shows an example of a microwave plasma CVD apparatus provided with four reaction chambers, and FIG. 10B shows an example of a microwave plasma CVD apparatus provided with three reaction chambers.

An example is described in which a gate insulating layer, a microcrystalline semiconductor film, a buffer layer, and a channel protective layer are formed using a plasma CVD apparatus shown in FIGS. 10A and 10B. Substrates are set in a cassette 1128 and a cassette 1129 of the loading chamber 1110 and the unloading chamber 1115, and transferred to the reaction chambers (1) 1111 to (4) 1114 by a transfer unit 1121 of the common chamber 1120. In this apparatus, reaction chambers can be allocated according to the films to be deposited, and a plurality of different films can be formed successively without being exposed to the atmosphere. In addition, the reaction chamber is also used as a reaction chamber for performing an etching process or laser irradiation process, in addition to a film-formation process. When reaction chambers for various processes are provided, various processes can be performed without exposing the substrate to the atmosphere.

In each of the reaction chambers (1) to (4), the gate insulating film, the microcrystalline semiconductor film, the buffer layer, and the channel protective layer are stacked. In this case, the plurality of different kinds of films can be stacked successively by changing source gases. Further, in this case, after the gate insulating film is formed, silicon hydride such as silane is introduced to the reaction chamber so that an oxygen residue is reacted with silicon hydride, and the reactant is ejected outside the reaction chamber; thus, the concentration of an oxygen residue in the reaction chamber can be reduced. Accordingly, the concentration of oxygen contained in the microcrystalline semiconductor film can be reduced. In addition, crystal grains included in the microcrystalline semiconductor film can be prevented from being oxidized.

Further, in a plasma CVD apparatus, films of one kind may be formed in a plurality of reaction chambers in order to improve productivity. When films of one kind can be formed in a plurality of reaction chambers, films can be concurrently formed over a plurality of substrates. For example, in FIG. 10A, the reaction chambers (1) and (2) are used as reaction chambers in each of which a microcrystalline semiconductor film is formed, the reaction chamber (3) is used as a reaction chamber in which an amorphous semiconductor film is formed, and the reaction chamber (4) is used as a reaction chamber in which a channel protective layer is formed. In the case where a plurality of substrates is concurrently treated as described above, a plurality of reaction chambers is provided, in each of which a film with a low deposition rate is formed, so that productivity can be improved.

Before a substrate is carried into a reaction chamber to perform film formation, it is preferable to perform cleaning, flush (washing) treatment (hydrogen flush, silane flush, or the like), and coating by which the inner wall of each reaction chamber is coated with a protective film that is a film to be formed (this coating is also referred to as pre-coating treatment). Pre-coating treatment is treatment in which plasma treatment is performed by flowing of a deposition gas in a reaction chamber to coat the inner wall of the reaction chamber with a thin protective film in advance. For example, before a microcrystalline silicon film is formed as the microcrystalline semiconductor film, pre-coating treatment may be performed in which the inner wall of the reaction chamber is coated with an amorphous silicon film with a thickness of 0.2 μm to 0.4 μm. Flush treatment (hydrogen flush, silane flush, or the like) may be performed after pre-coating treatment. In the case of performing cleaning and pre-coating treatment, it is necessary that the substrate be carried out from a reaction chamber. However, in the case of performing flush treatment (hydrogen flush, silane flush, or the like), a substrate may be in a reaction chamber because plasma treatment is not performed.

A protective film formed of an amorphous silicon film is formed on the inner wall of a reaction chamber in which a microcrystalline silicon film is formed, and hydrogen plasma treatment is performed before film formation. In this case, the protective film is etched and an extremely small amount of silicon is deposited on a substrate. The silicon can be a nucleus of crystal growth.

In this manner, with use of the microwave plasma CVD apparatus in which the plurality of chambers is connected, the gate insulating film, the microcrystalline semiconductor film, the buffer layer, the channel protective layer, and the semiconductor film to which an impurity element imparting one conductivity type is added can be concurrently formed; thus, the mass productivity can be enhanced. Further, also when one reaction chamber is being subjected to maintenance or cleaning, the films can be formed in other reaction chambers, and the films can be formed efficiently. In addition, an interface between the films can be formed without being contaminated by atmospheric components or impurity elements contained in the atmosphere; thus, variation in characteristics of the thin film transistors can be reduced.

With use of the microwave plasma CVD apparatus having such a structure, films of similar kinds or one kind can be formed in each reaction chamber, and the films can be successively formed without being exposed to the atmosphere. Thus, an interface between the films can be formed without being contaminated by a residue of another film which has already been formed or impurity elements contained in the atmosphere.

Further, a microwave generator and a high frequency wave generator may be provided; thus, the gate insulating film, the microcrystalline semiconductor film, the channel protective layer, and the semiconductor film to which an impurity element imparting one conductivity type is added may be formed by a microwave plasma CVD method, and the buffer layer may be formed by a high frequency plasma CVD method.

Although the microwave plasma CVD apparatus in FIGS. 10A and 10B is provided with the loading chamber and the unloading chamber separately, a loading chamber and an unloading chamber may be combined and a loading/unloading chamber may be provided. In addition, the microwave plasma CVD apparatus may be provided with a spare chamber. By pre-heating of the substrate in the spare chamber, it is possible to shorten heating time before formation of the film in each reaction chamber, so that the throughput can be improved. In the film-formation treatment, a gas supplied from a gas supply portion may be selected in accordance with its purpose.

This embodiment mode can be combined with the structure disclosed in other embodiment modes, as appropriate.

Embodiment Mode 5

This embodiment mode will describe examples of liquid crystal display devices including the thin film transistors described in Embodiment Modes 1 to 4 with reference to FIGS. 12 to 25. A TFT 628 and a TFT 629 used for liquid crystal display devices shown in FIGS. 12 to 25 can be manufactured in a similar manner to the thin film transistor described in Embodiment Mode 1 or 2 and have high electric characteristics and high reliability. The TFT 628 and the TFT 629 include a channel protective layer 608 and a channel protective layer 611, respectively, and are inverted staggered thin film transistors including microcrystalline semiconductor films as channel formation regions.

First, a vertical alignment (VA) liquid crystal display device is described. The VA liquid crystal display device has a kind of form in which alignment of liquid crystal molecules of a liquid crystal display panel is controlled. The VA liquid crystal display device has a form in which liquid crystal molecules are vertical to a panel surface when voltage is not applied. In particular, in this embodiment mode, it is devised that a pixel is divided into several regions (sub-pixels) so that molecules are aligned in different directions in the respective regions. This is referred to as domain multiplication or multi-domain design. In the following description, a liquid crystal display device with multi-domain design is described.

Figure 12:
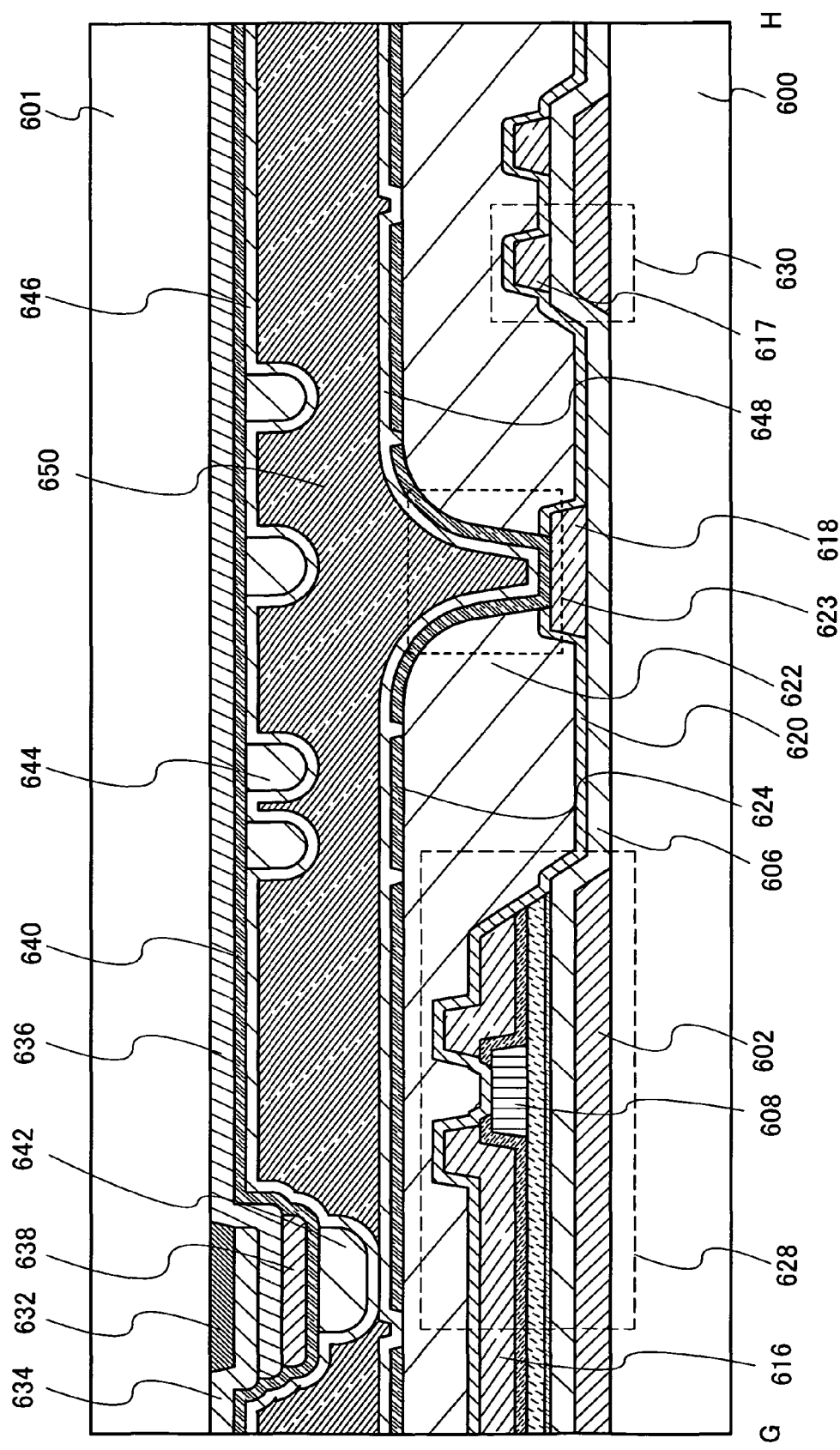
FIG. 12 shows a liquid crystal display device of the present invention.
Figure 13:
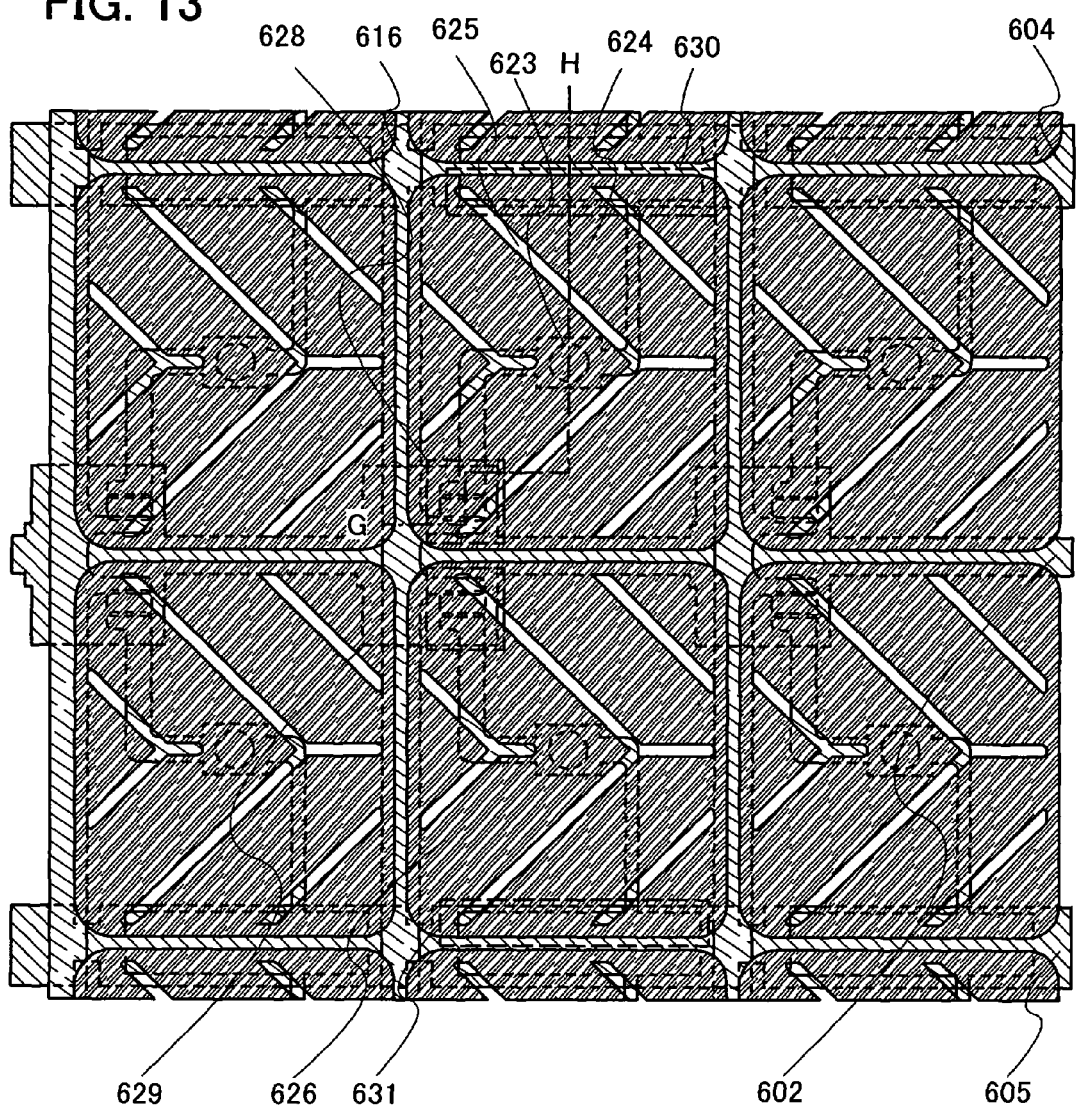
FIG. 13 shows a liquid crystal display device of the present invention.
Figure 14:
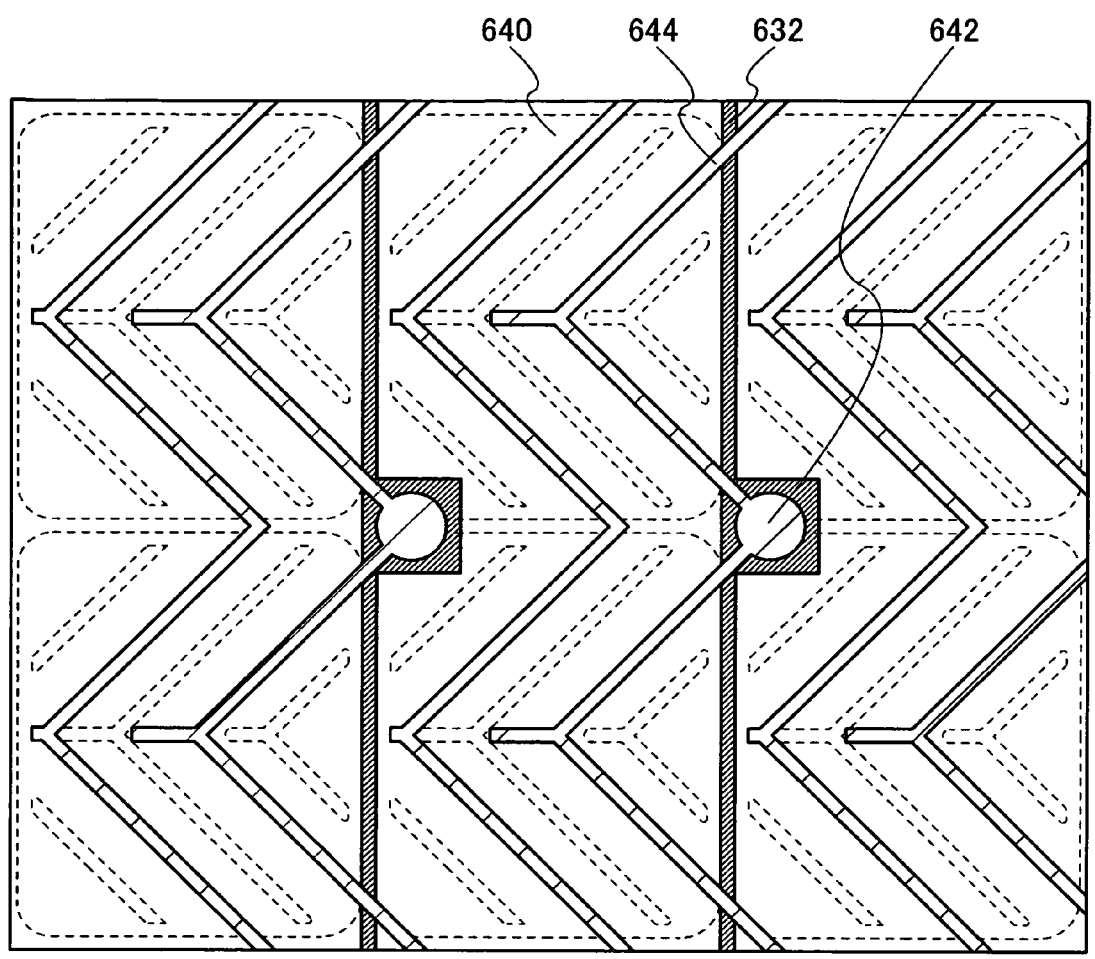
FIG. 14 shows a liquid crystal display device of the present invention.

FIG. 13 and FIG. 14 show a pixel electrode and a counter electrode, respectively. FIG. 13 is a plane view of a side of a substrate provided with the pixel electrode. FIG. 12 shows a cross-sectional structure along a line G-H in FIG. 13. FIG. 14 is a plane view of a side of a substrate provided with the counter electrode. Hereinafter, description is made with reference to these drawings.

FIG. 12 shows a state in which a substrate 600 provided with a TFT 628, a pixel electrode 624 connected to the TFT 628, and a storage capacitor portion 630 overlaps with a counter substrate 601 provided with a counter electrode 640 and the like, and liquid crystal is injected therebetween.

At the position where the counter substrate 601 is provided with a spacer 642, a light-blocking film 632, a first color film 634, a second color film 636, a third color film 638, and the counter electrode 640 are formed. With this structure, the height of a projection 644 for controlling alignment of the liquid crystal and the height of the spacer 642 vary. An alignment film 648 is formed over the pixel electrode 624. Similarly, the counter electrode 640 is also provided with an alignment film 646. A liquid crystal layer 650 is formed between the alignment films 646 and 648.

Although a columnar spacer is used for the spacer 642 in this embodiment mode, bead spacers may be dispersed. Further, the spacer 642 may also be formed over the pixel electrode 624 provided over the substrate 600.

The TFT 628, the pixel electrode 624 connected to the TFT 628, and the storage capacitor portion 630 are formed over the substrate 600. The pixel electrode 624 is connected to a wiring 618 via a contact hole 623 which penetrates an insulating film 620 which covers the TFT 628, the wiring 618, and the storage capacitor portion 630 and also penetrates a third insulating film 622 which covers the insulating film 620. The thin film transistor described in Embodiment Mode 1 can be used as the TFT 628 as appropriate. The storage capacitor portion 630 includes a first capacitor wiring 604 which is formed in a similar manner to a gate wiring 602 of the TFT 628, a gate insulating film 606, and a second capacitor wiring 617 which is formed in a similar manner to a wiring 616 and the wiring 618. In FIGS. 12, 13, 14, and 15, in the TFT 628, a microcrystalline semiconductor film, a buffer layer, semiconductor films to which an impurity element imparting one conductivity type is added and which function as source and drain regions, and wirings which also function as source and drain electrodes are patterned by the same etching process and stacked with almost the same shape.

A liquid crystal element is formed by overlapping of the pixel electrode 624, the liquid crystal layer 650, and the counter electrode 640.

FIG. 13 shows a structure over the substrate 600. The pixel electrode 624 is formed using the material described in Embodiment Mode 1. The pixel electrode 624 is provided with a slit 625. The slit 625 is for controlling alignment of the liquid crystal.

A TFT 629, a pixel electrode 626 connected to the TFT 629, and a storage capacitor portion 631 shown in FIG. 13 can be formed in a similar manner to the TFT 628, the pixel electrode 624, and the storage capacitor portion 630, respectively. Both the TFT 628 and the TFT 629 are connected to the wiring 616. A pixel of this liquid crystal display panel includes the pixel electrodes 624 and 626. Each of the pixel electrodes 624 and 626 is in a sub-pixel.

FIG. 14 shows a structure of the counter substrate side. The counter electrode 640 is formed over the light-blocking film 632. The counter electrode 640 is preferably formed using a material similar to that of the pixel electrode 624. The projection 644 for controlling alignment of the liquid crystal is formed over the counter electrode 640. Moreover, the spacer 642 is formed corresponding to the position of the light-blocking film 632.

Figure 15:
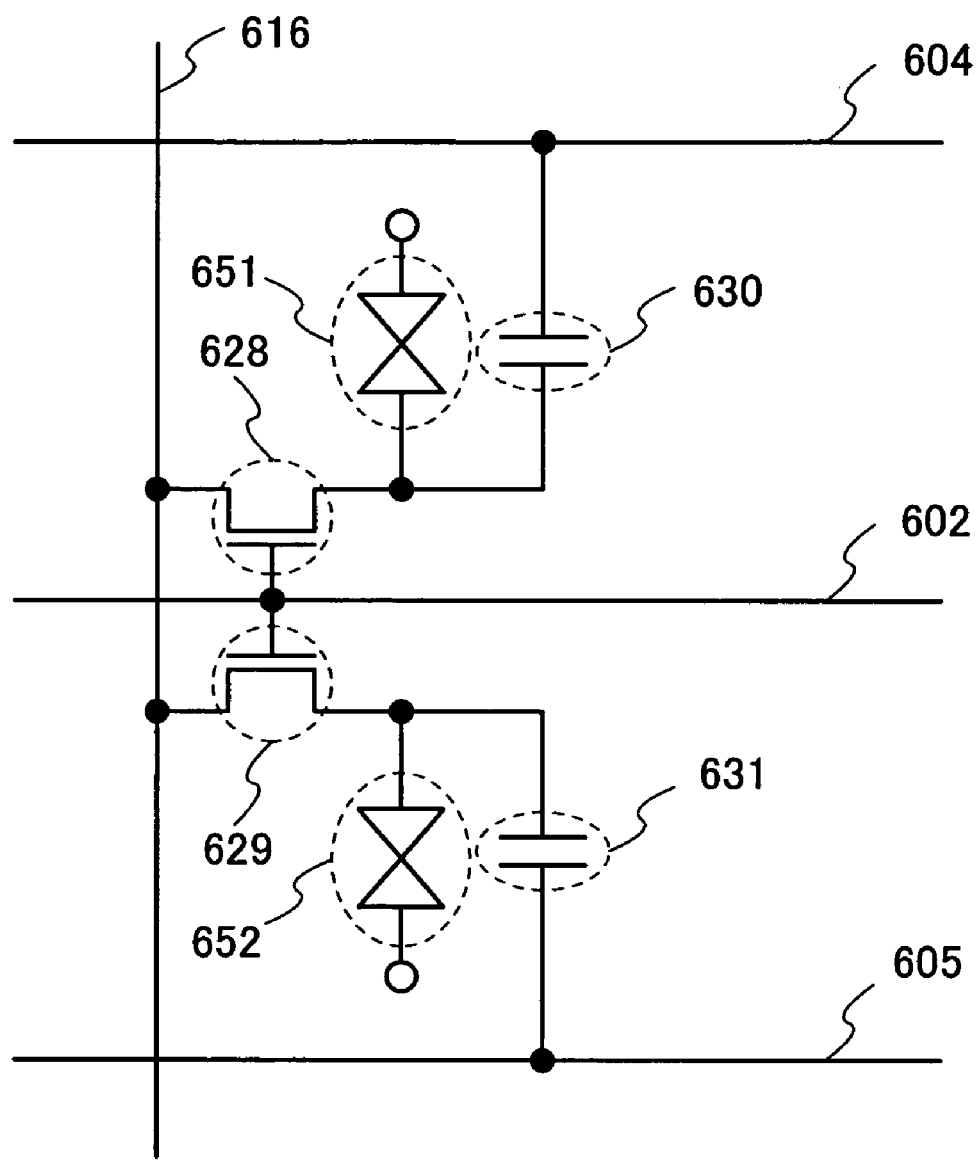
FIG. 15 shows a liquid crystal display device of the present invention.

FIG. 15 shows an equivalent circuit of this pixel structure. Both the TFT 628 and the TFT 629 are connected to the gate wiring 602 and the wiring 616. In this case, when potentials of the capacitor wiring 604 and a capacitor wiring 605 are different from each other, operations of liquid crystal elements 651 and 652 can vary. That is, alignment of the liquid crystal is precisely controlled and a viewing angle is increased by individual control of potentials of the capacitor wirings 604 and 605.

When voltage is applied to the pixel electrode 624 provided with the slit 625, electric field distortion (an oblique electric field) is generated near the slit 625. The slit 625 and the projection 644 on the counter substrate 601 side are alternately arranged in an engaging manner, and thus, an oblique electric field is effectively generated to control alignment of the liquid crystal, so that a direction of alignment of the liquid crystal varies depending on location. That is, a viewing angle of the liquid crystal display panel is increased by domain multiplication.

Next, another VA liquid crystal display device, which is different from the above-described device, is described with reference to FIG. 16, FIG. 17, FIG. 18, and FIG. 19.

Figure 16:
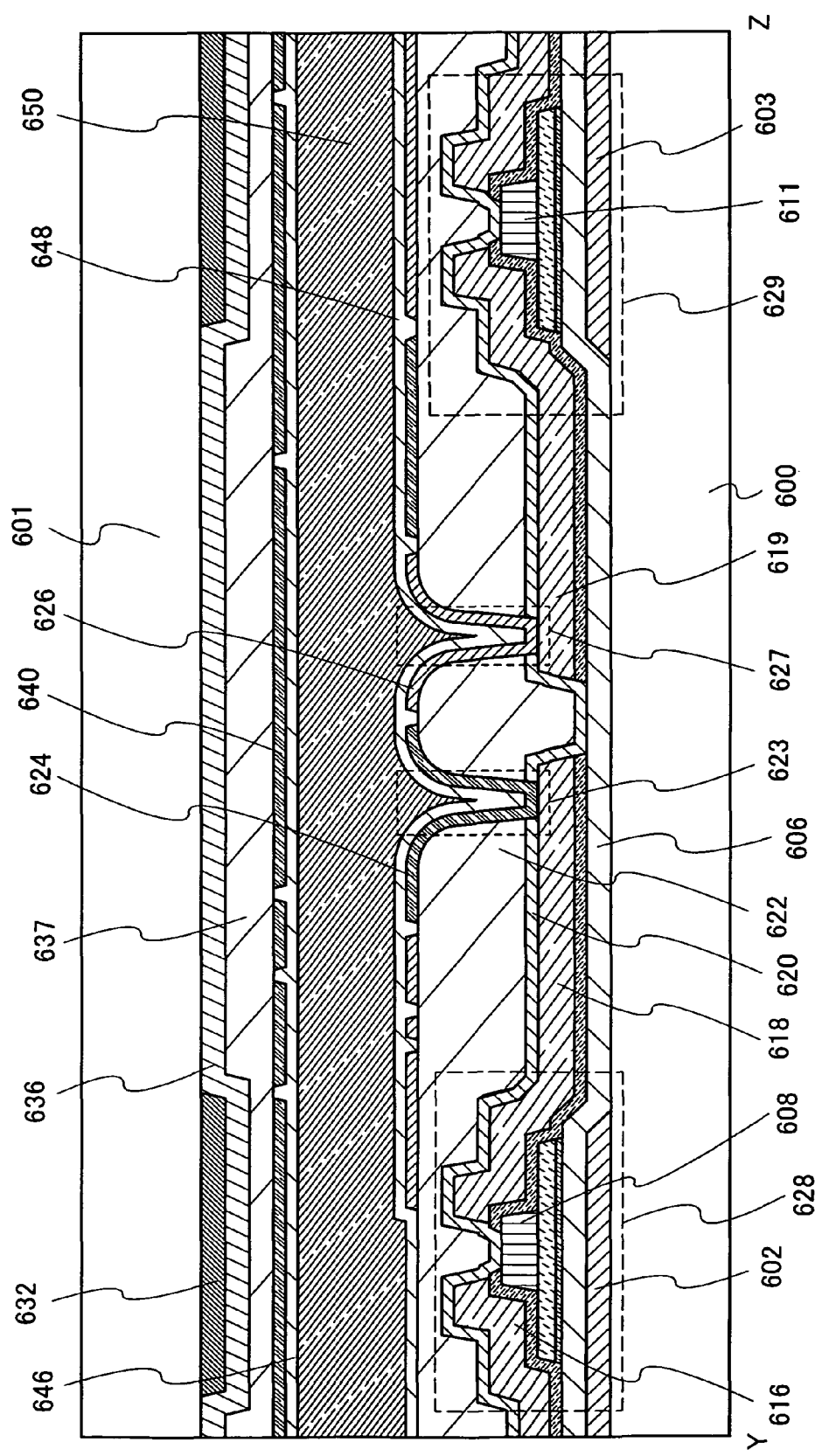
FIG. 16 shows a liquid crystal display device of the present invention.
Figure 17:
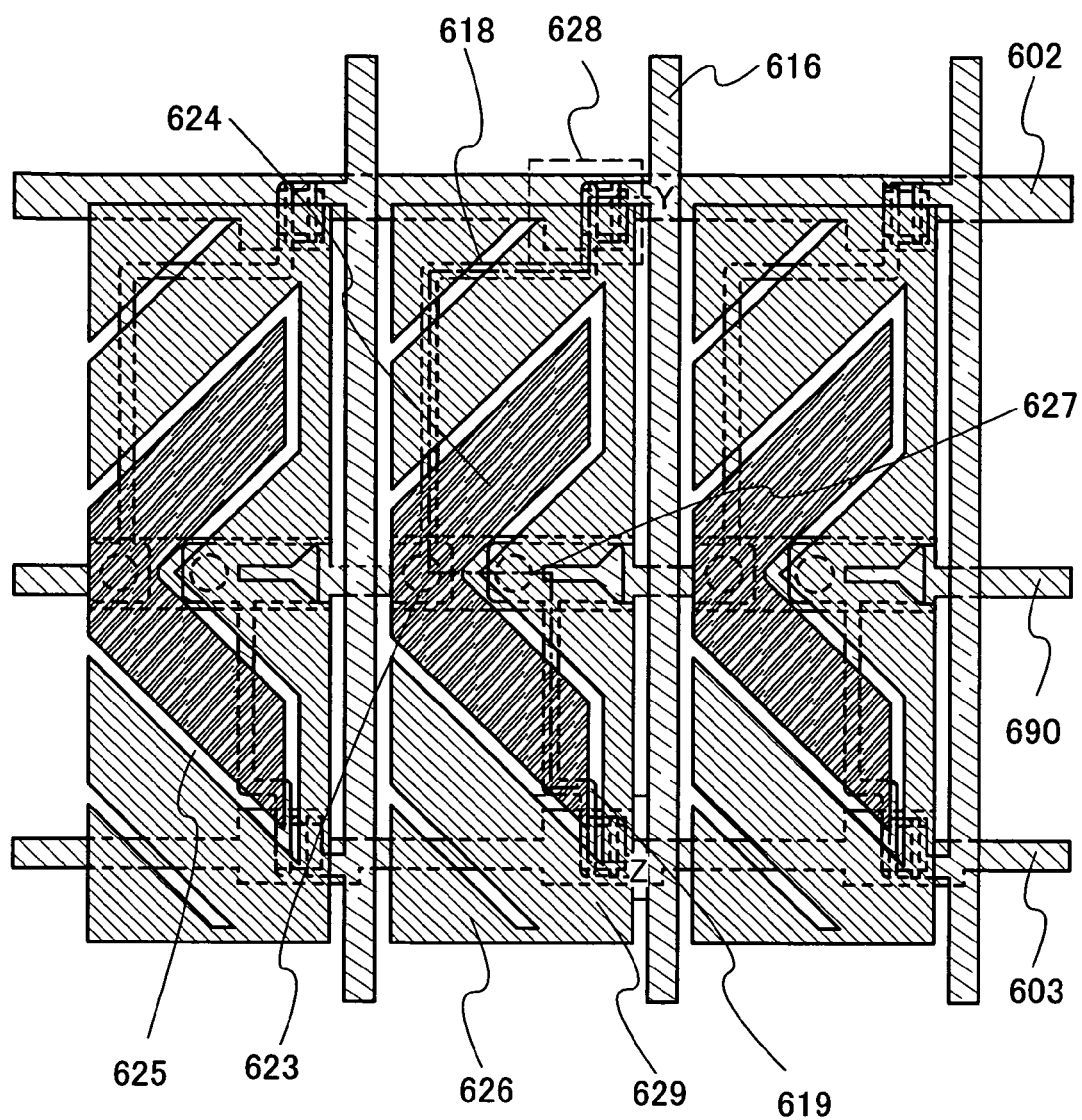
FIG. 17 shows a liquid crystal display device of the present invention.

FIG. 16 and FIG. 17 each show a pixel structure of a VA liquid crystal display panel. FIG. 17 is a plane view of a substrate 600. FIG. 16 shows a cross-sectional structure along a line Y-Z in FIG. 17. Hereinafter, description is made with reference to these drawings.

In this pixel structure, a plurality of pixel electrodes is included in one pixel, and a TFT is connected to each pixel electrode. Each TFT is driven by a different gate signal. That is, this is a structure in which a signal supplied to each pixel electrode is individually controlled in a multi-domain pixel.

Via a contact hole 623, a pixel electrode 624 is connected to a TFT 628 through a wiring 618. Via a contact hole 627, a pixel electrode 626 is connected to a TFT 629 through a wiring 619. A gate wiring 602 of the TFT 628 and a gate wiring 603 of the TFT 629 are separated so that different gate signals can be given thereto. In contrast, a wiring 616 functioning as a data line is used in common for the TFTs 628 and 629. As each of the TFTs 628 and 629, the thin film transistor described in Embodiment Mode 1 can be used as appropriate. Also, a capacitor wiring 690 is provided. In FIGS. 16 to 25, in the TFT 628 and the TFT 629, semiconductor films to which an impurity element imparting one conductivity type is added and which function as source and drain regions and wirings which also function as source and drain electrodes are patterned by the same etching process and stacked with almost the same shape.

Figure 19:
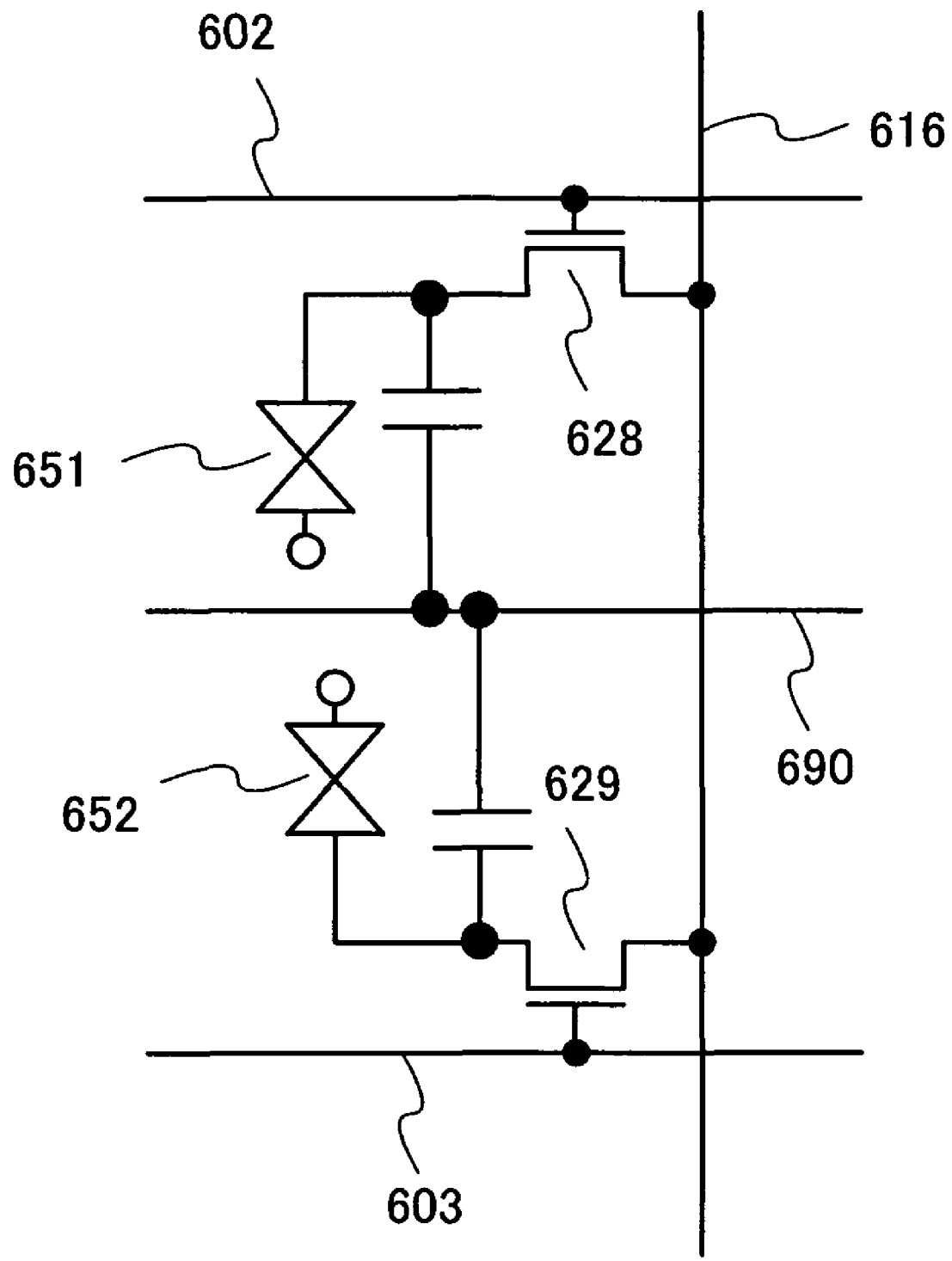
FIG. 19 shows a liquid crystal display device of the present invention.

The pixel electrodes 624 and 626 have different shapes and are separated by the slit 625. The pixel electrode 626 is formed so as to surround the external side of the pixel electrode 624 which is spread into a V shape. Timing of voltage application is made to vary between the pixel electrodes 624 and 626 by the TFTs 628 and 629 in order to control alignment of the liquid crystal. FIG. 19 shows an equivalent circuit of this pixel structure. The TFT 628 is connected to the gate wiring 602. The TFT 629 is connected to the gate wiring 603. When different gate signals are supplied to the gate wirings 602 and 603, operation timings of the TFTs 628 and 629 can vary.

Figure 18:
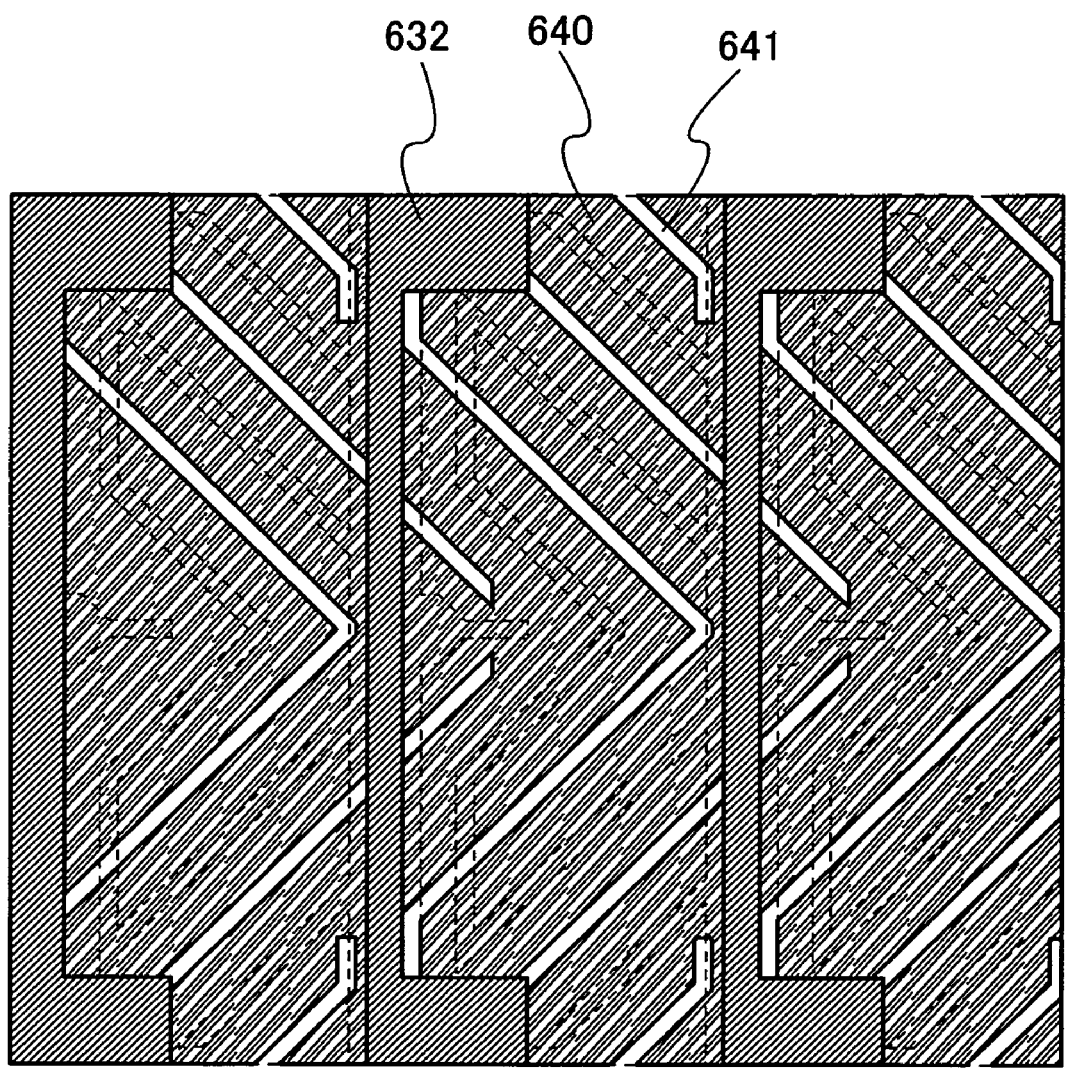
FIG. 18 shows a liquid crystal display device of the present invention.

A counter substrate 601 is provided with a light-blocking film 632, a second color film 636, and a counter electrode 640. Moreover, a planarization film 637 is formed between the second color film 636 and the counter electrode 640 to prevent alignment disorder of the liquid crystal. FIG. 18 shows a structure of the counter substrate side. A slit 641 is formed in the counter electrode 640, which is used in common between different pixels. The slit 641 and the slit 625 on the pixel electrodes 624 and 626 side are alternately arranged in an engaging manner; thus, an oblique electric field is effectively generated, and alignment of the liquid crystal can be controlled. Accordingly, a direction in which the liquid crystal is aligned can vary depending on location, and a viewing angle is increased.

A first liquid crystal element is formed by overlapping of the pixel electrode 624, a liquid crystal layer 650, and the counter electrode 640. A second liquid crystal element is formed by overlapping of the pixel electrode 626, the liquid crystal layer 650, and the counter electrode 640. This is a multi-domain structure in which the first liquid crystal element and the second liquid crystal element are included in one pixel.

Next, a horizontal electric field liquid crystal display device is described. The horizontal electric field mode is a mode in which an electric field is horizontally applied to liquid crystal molecules in a cell, whereby the liquid crystal is driven to express a gray scale. By this method, a viewing angle can be increased to approximately 180 degrees. Hereinafter, a liquid crystal display device employing the horizontal electric field mode is described.

Figure 20:
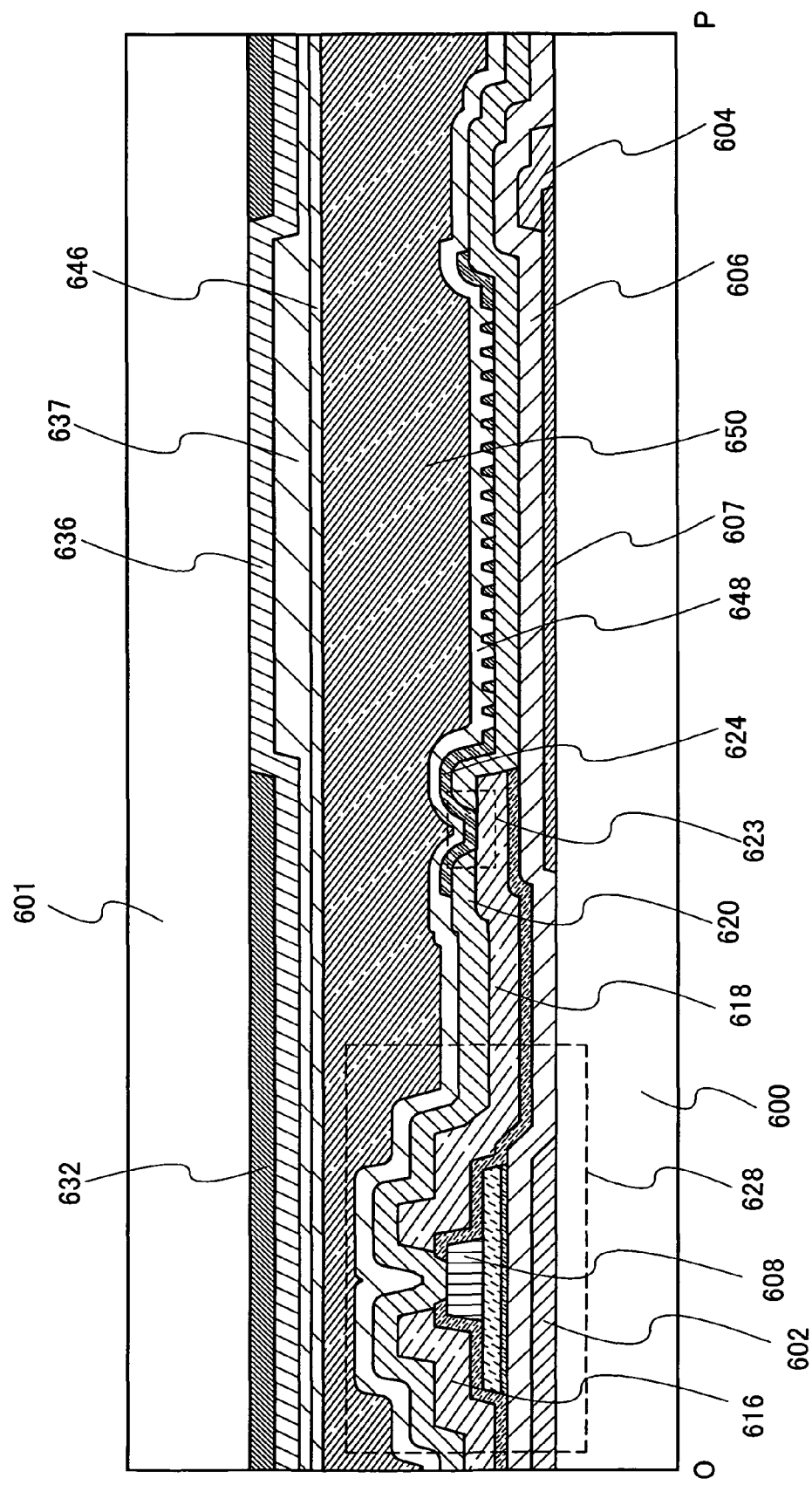
FIG. 20 shows a liquid crystal display device of the present invention.

FIG. 20 shows a state in which a substrate 600 provided with a TFT 628 and a pixel electrode 624 connected to the TFT 628 overlaps with a counter substrate 601, and liquid crystal is injected therebetween. The counter substrate 601 is provided with a light-blocking film 632, a second color film 636, a planarization film 637, and the like. The pixel electrode is provided on the substrate 600 side, and it is not provided on the counter substrate 601 side. A liquid crystal layer 650 is formed between the substrate 600 and the counter substrate 601.

A first pixel electrode 607, a capacitor wiring 604 connected to the first pixel electrode 607, and the TFT 628 described in Embodiment Mode 1 are formed over the substrate 600. The first pixel electrode 607 can be formed using a material similar to that of the pixel electrode 77 described in Embodiment Mode 1. The first pixel electrode 607 is formed into a shape which is compartmentalized roughly into a pixel shape. Note that a gate insulating film 606 is formed over the first pixel electrode 607 and the capacitor wiring 604.

Wirings 616 and 618 of the TFT 628 are formed over the gate insulating film 606. The wiring 616 serves as a data line extending in one direction, through which a video signal is transmitted in a liquid crystal display panel, and is connected to a source region of the TFT 628 and serves as one of a source electrode and a drain electrode. The wiring 618 serves as the other of the source electrode and the drain electrode, and is connected to a second pixel electrode 624.

A second insulating film 620 is formed over the wirings 616 and 618. Over the insulating film 620, the second pixel electrode 624 connected to the wiring 618 via a contact hole formed in the insulating film 620 is formed. The pixel electrode 624 is formed using a material similar to that of the pixel electrode 77 described in Embodiment Mode 1.

In such a manner, the TFT 628 and the second pixel electrode 624 connected to the TFT 628 are formed over the substrate 600. Note that a storage capacitor is formed between the first pixel electrode 607 and the second pixel electrode 624.

Figure 21:
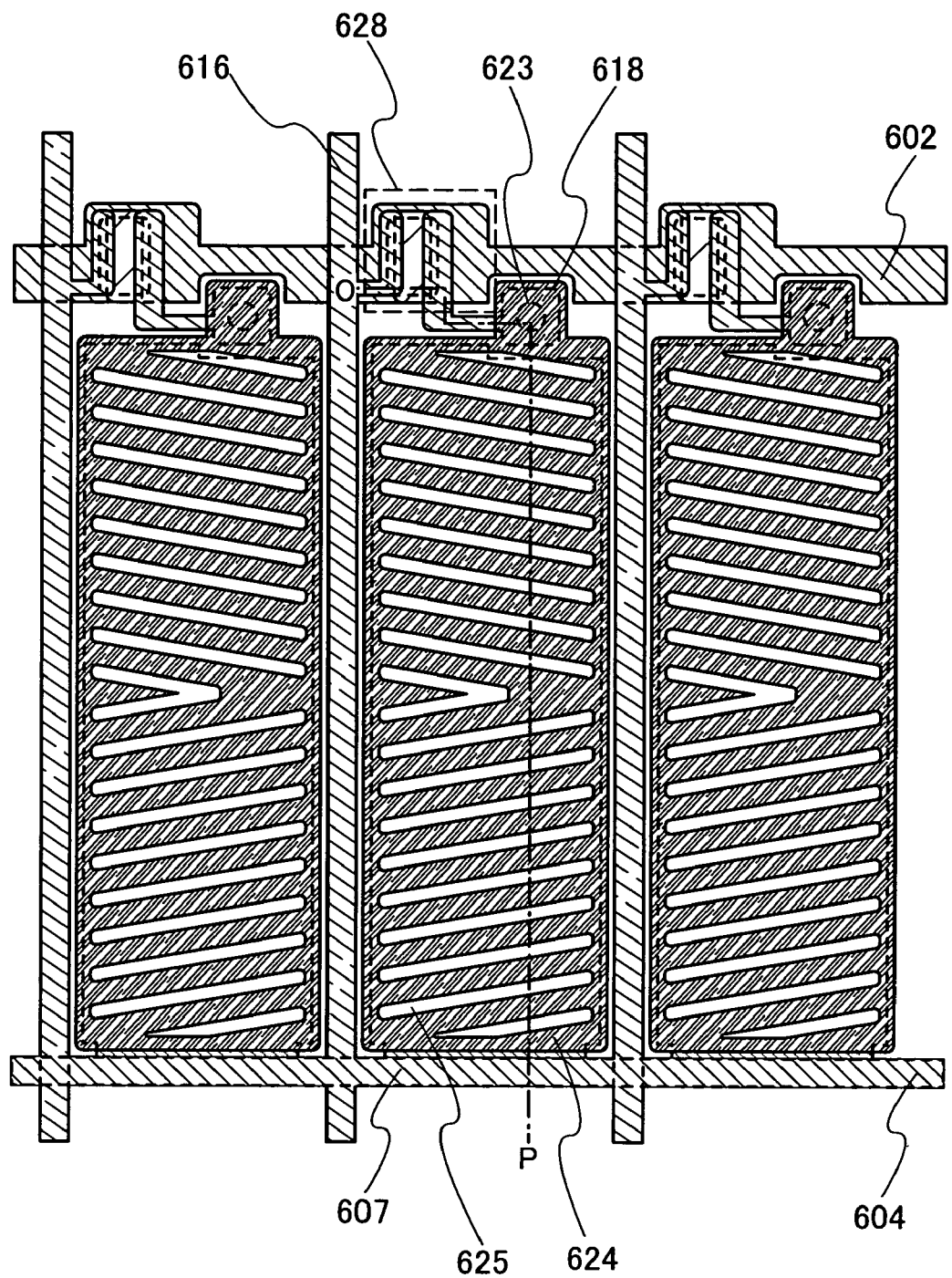
FIG. 21 shows a liquid crystal display device of the present invention.

FIG. 21 is a plane view showing a structure of the pixel electrode. FIG. 20 shows a cross-sectional structure taken along a line O-P in FIG. 21. The pixel electrode 624 is provided with a slit 625. The slit 625 is for controlling alignment of the liquid crystal. In this case, an electric field is generated between the first pixel electrode 607 and the second pixel electrode 624. The thickness of the gate insulating film 606 formed between the first pixel electrode 607 and the second pixel electrode 624 is 50 nm to 200 nm, which is thin enough compared to the liquid crystal layer with a thickness of 2 μm to 10 μm. Accordingly, an electric field is generated substantially in parallel (in a horizontal direction) to the substrate 600. Alignment of the liquid crystal is controlled by the electric field. The liquid crystal molecules are horizontally rotated using the electric field which is approximately parallel to the substrate. In this case, since the liquid crystal molecules are parallel to the substrate in any state, contrast or the like is less affected by change in angle of viewing, and a viewing angle is increased. Further, since both the first pixel electrode 607 and the second pixel electrode 624 are light-transmitting electrodes, an aperture ratio can be increased.

Next, another example of a horizontal electric field liquid crystal display device is described.

Figure 22:
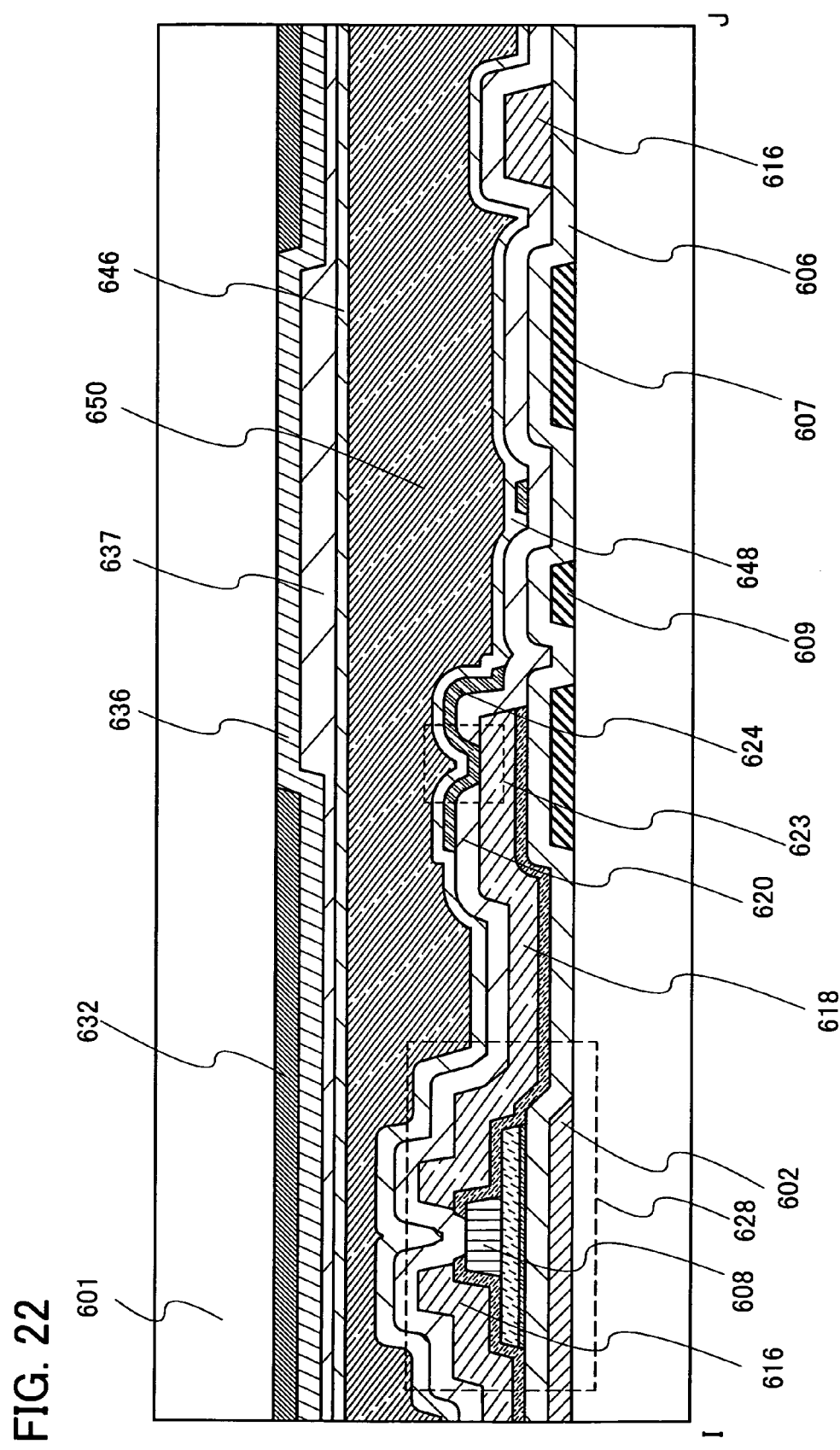
FIG. 22 shows a liquid crystal display device of the present invention.
Figure 23:
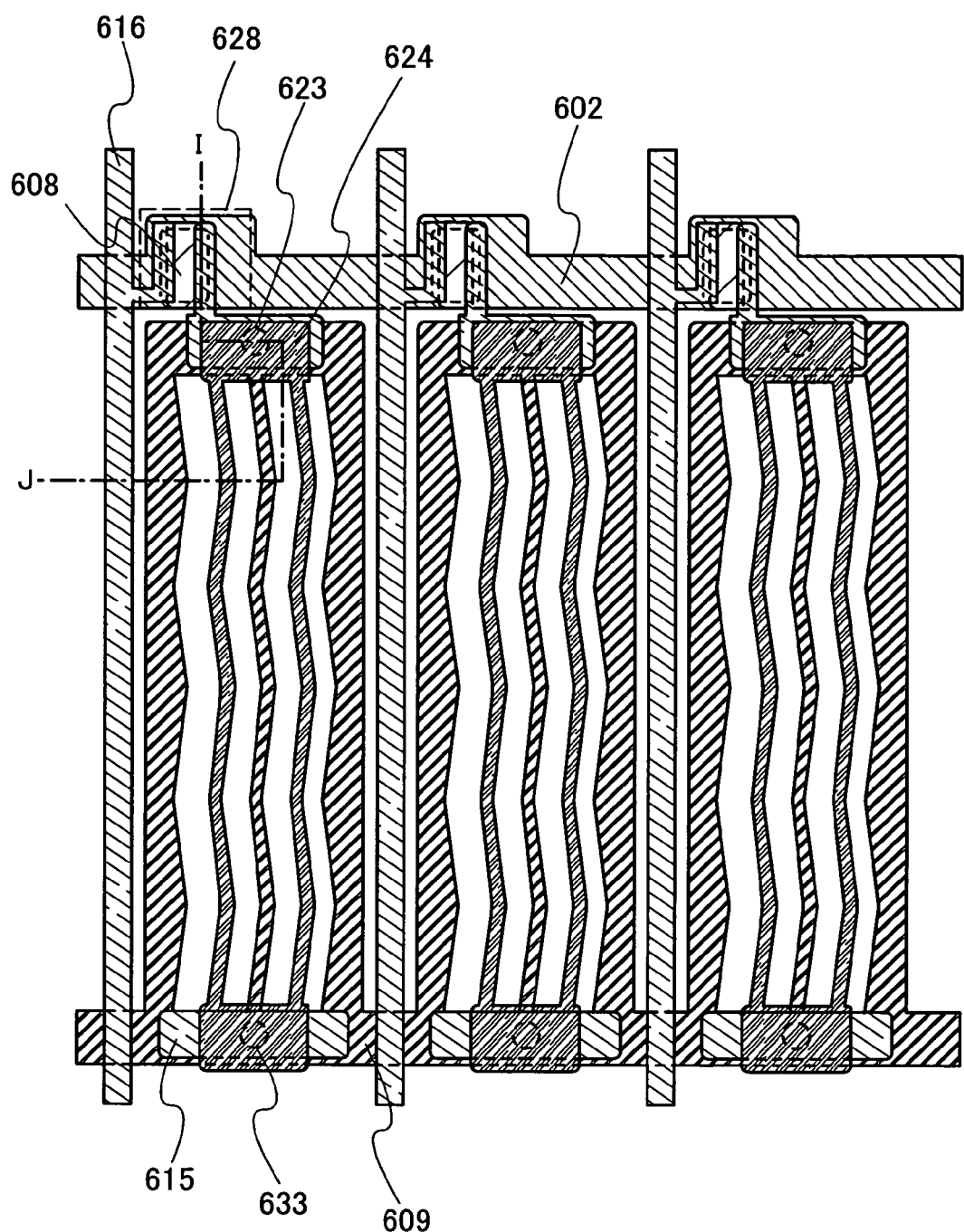
FIG. 23 shows a liquid crystal display device of the present invention.

FIG. 22 and FIG. 23 each show a pixel structure of an IPS liquid crystal display device. FIG. 23 is a plane view. FIG. 22 shows a cross-sectional structure along a line I-J in FIG. 23. Hereinafter, description is made with reference to these drawings.

FIG. 22 shows a state in which a substrate 600 provided with a TFT 628 and a pixel electrode 624 connected to the TFT 628 overlaps with a counter substrate 601, and liquid crystal is injected therebetween. The counter substrate 601 is provided with a light-blocking film 632, a second color film 636, a planarization film 637, and the like. The pixel electrode is provided on the substrate 600 side, and it is not provided on the counter substrate 601 side. A liquid crystal layer 650 is formed between the substrate 600 and the counter substrate 601.

A common potential line 609 and the TFT 628 described in Embodiment Mode 1 are formed over the substrate 600. The common potential line 609 can be formed at the same time as a gate wiring 602 of the TFT 628. A first pixel electrode 607 is formed into a shape which is compartmentalized roughly into a pixel shape.

Wirings 616 and 618 of the TFT 628 are formed over a gate insulating film 606. The wiring 616 serves as a data line extending in one direction, through which a video signal is transmitted in a liquid crystal display panel, and is connected to a source region of the TFT 628 and serves as one of a source electrode and a drain electrode. The wiring 618 serves as the other of the source electrode and the drain electrode, and is connected to a second pixel electrode 624.

A second insulating film 620 is formed over the wirings 616 and 618. Over the insulating film 620, the second pixel electrode 624 connected to the wiring 618 via a contact hole 623 formed in the insulating film 620 is formed. The pixel electrode 624 is formed using a material similar to that of the pixel electrode 77 described in Embodiment Mode 1. Note that as shown in FIG. 23, the pixel electrode 624 is formed so as to generate a horizontal electric field with a comb-shaped electrode which is formed at the same time as the common potential line 609. Moreover, the pixel electrode 624 is formed so that comb-teeth portions of the pixel electrode 624 are alternately engaged with the comb-shaped electrode which is formed at the same time as the common potential line 609.

Alignment of the liquid crystal is controlled by an electric field generated between a potential applied to the pixel electrode 624 and a potential of the common potential line 609. The liquid crystal molecules are horizontally rotated using the electric field which is approximately parallel to the substrate. In this case, since the liquid crystal molecules are parallel to the substrate in any state, contrast or the like is less affected by change in angle of viewing, and a viewing angle is increased.

In such a manner, the TFT 628 and the pixel electrode 624 connected to the TFT 628 are formed over the substrate 600. A storage capacitor is formed by the common potential line 609, a capacitor electrode 615, and the gate insulating film 606 provided therebetween. The capacitor electrode 615 and the pixel electrode 624 are connected via a contact hole 633.

Next, a mode of a TN liquid crystal display device is described.

Figure 24:
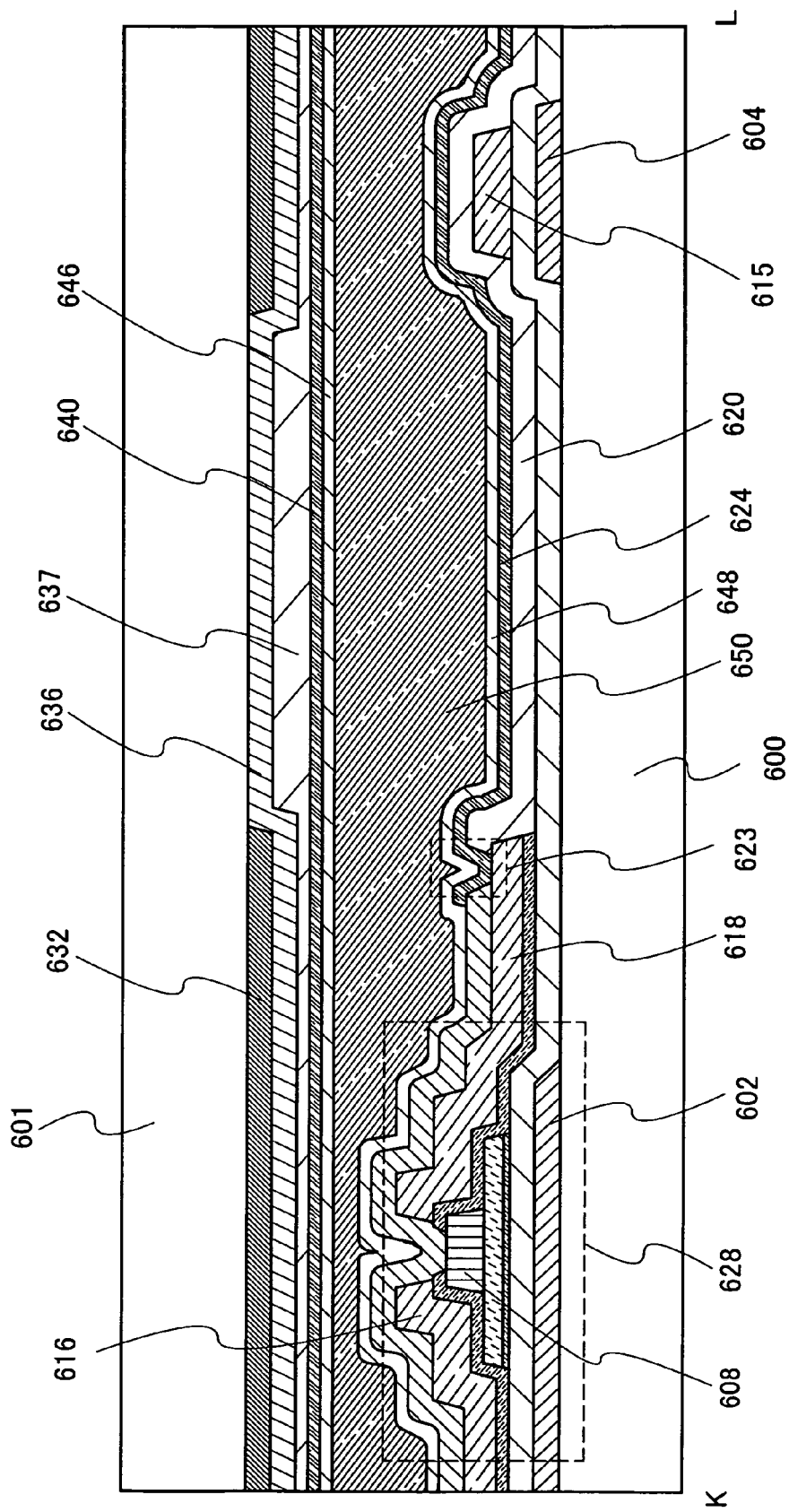
FIG. 24 shows a liquid crystal display device of the present invention.
Figure 25:
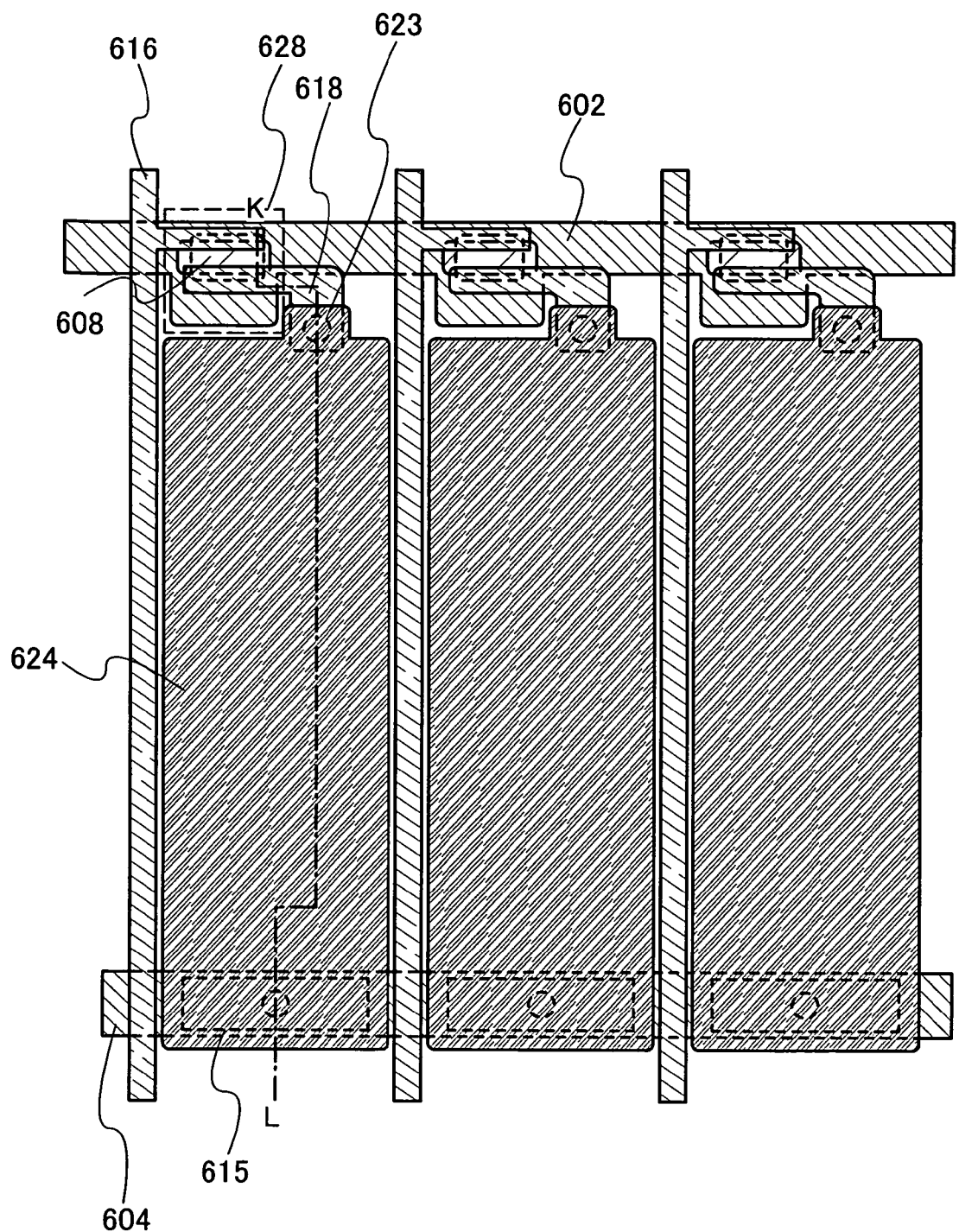
FIG. 25 shows a liquid crystal display device of the present invention.

FIG. 24 and FIG. 25 each show a pixel structure of a TN liquid crystal display device. FIG. 25 is a plane view. FIG. 24 shows a cross-sectional structure along a line K-L in FIG. 25. Hereinafter, description is made with reference to these drawings.

A pixel electrode 624 is connected to a TFT 628 through a wiring 618 via a contact hole 623. A wiring 616 functioning as a data line is connected to the TFT 628. As the TFT 628, any of the TFTs described in Embodiment Mode 1 can be used.

The pixel electrode 624 is formed using the pixel electrode 77 described in Embodiment Mode 1.

A counter substrate 601 is provided with a light-blocking film 632, a second color film 636, and a counter electrode 640. A planarization film 637 is formed between the second color film 636 and the counter electrode 640 to prevent alignment disorder of liquid crystal. A liquid crystal layer 650 is formed between the pixel electrode 624 and the counter electrode 640, with alignment films 648 and 649 interposed.

A liquid crystal element is formed by overlapping of the pixel electrode 624, the liquid crystal layer 650, and the counter electrode 640.

The substrate 600 or the counter substrate 601 may also be provided with a color filter, a blocking film (a black matrix) for preventing disclination, or the like. Further, a polarizing plate is attached to a surface of the substrate 600, which is opposite to a surface on which the thin film transistor is formed. Moreover, a polarizing plate is attached to a surface of the counter substrate 601, which is opposite to a surface on which the counter electrode 640 is formed.

Through the above-described steps, the liquid crystal display device can be formed. Since a thin film transistor with small off current, high electric characteristics, and high reliability is used for the liquid crystal display device of this embodiment mode, the liquid crystal display device has high contrast and high visibility.

Embodiment Mode 6

This embodiment mode will describe below a structure of a liquid crystal display panel (also referred to as a liquid crystal panel) which is one mode of the liquid crystal display device of the present invention.

Figure 9A:
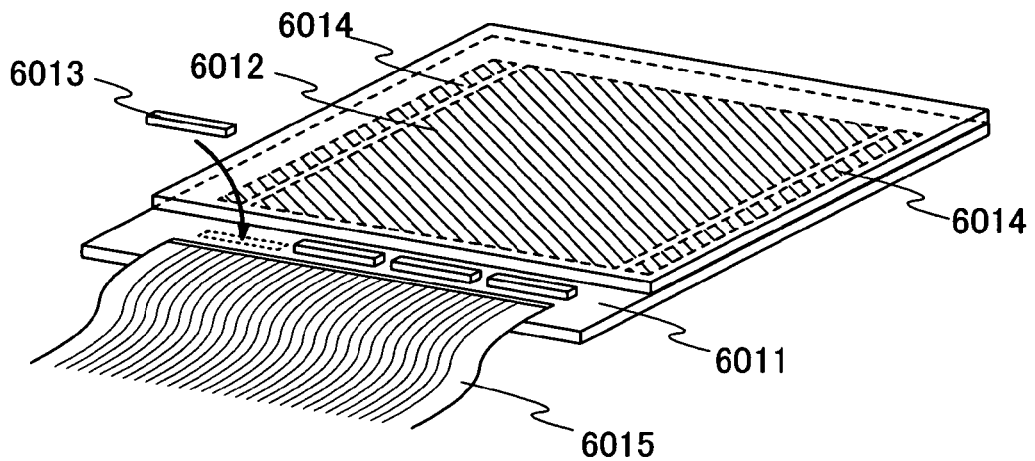
FIGS. 9A to 9C show a liquid crystal display device of the present invention.

FIG. 9A shows a mode of a liquid crystal display panel in which a pixel portion 6012 formed over a substrate 6011 is connected to a signal line driver circuit 6013 which is separately formed. The pixel portion 6012 and a scanning line driver circuit 6014 are each formed with a thin film transistor which uses a microcrystalline semiconductor film. By forming the signal line driver circuit with a thin film transistor by which higher mobility can be obtained compared to a thin film transistor using the microcrystalline semiconductor film, operation of the signal line driver circuit which demands a higher driving frequency than that of the scanning line driver circuit can be stabilized. Note that the signal line driver circuit 6013 may be formed with a transistor using a single-crystalline semiconductor, a thin film transistor using a polycrystalline semiconductor, or a thin film transistor using SOI. The pixel portion 6012, the signal line driver circuit 6013, and the scanning line driver circuit 6014 are each supplied with potential of a power source, a variety of signals, and the like via an FPC 6015.

Note that the signal driver circuit and the scanning line driver circuit may both be formed over the same substrate as that of the pixel portion.

Figure 9B:
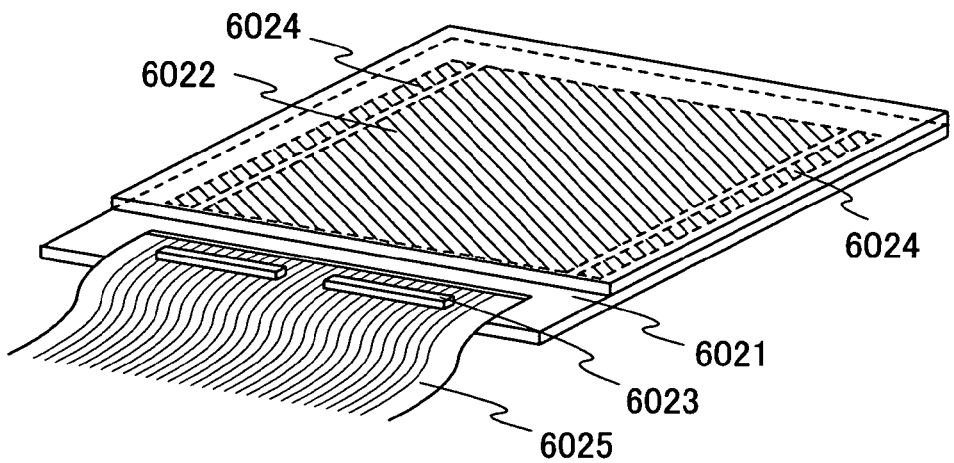

Also, when the driver circuit is separately formed, a substrate provided with the driver circuit is not always required to be attached to a substrate provided with the pixel portion, and may be attached to, for example, the FPC. FIG. 9B shows a mode of a liquid crystal display panel in which a signal line driver circuit 6023 is separately formed and connected to a pixel portion 6022 and a scanning line driver circuit 6024 which are formed over a substrate 6021. The pixel portion 6022 and the scanning line driver circuit 6024 are each formed with a thin film transistor which uses a microcrystalline semiconductor film. The signal line driver circuit 6023 is connected to the pixel portion 6022 via an FPC 6025. The pixel portion 6022, the signal line driver circuit 6023, and the scanning line driver circuit 6024 are each supplied with potential of a power source, a variety of signals, and the like via the FPC 6025.

Figure 9C:
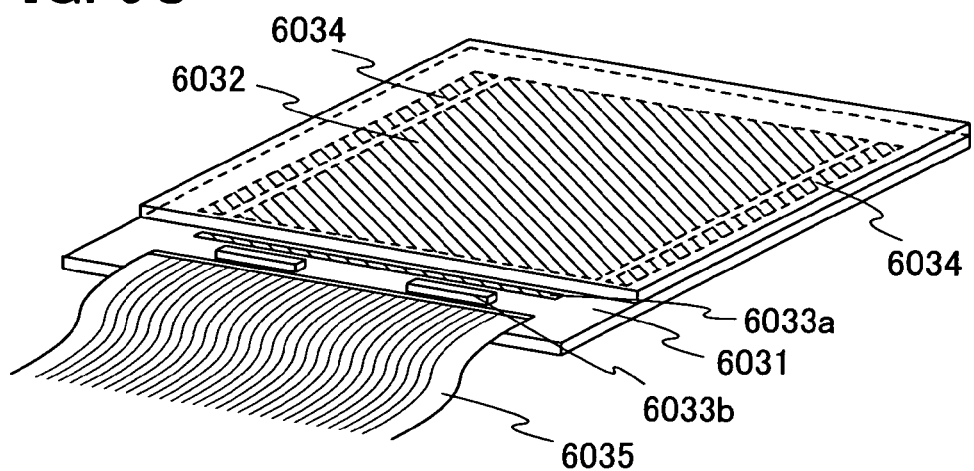

Also, part of the signal line driver circuit or part of the scanning line driver circuit may be formed over the same substrate as that of the pixel portion using the thin film transistor which uses a microcrystalline semiconductor film, and the rest may be formed separately and electrically connected to the pixel portion. FIG. 9C shows a mode of a liquid crystal display panel in which an analog switch 6033a included in the signal line driver circuit is formed over a substrate 6031, over which a pixel portion 6032 and a scanning line driver circuit 6034 are formed, and a shift register 6033b included in the signal line driver circuit is formed over a different substrate separately and then attached to the substrate 6031. The pixel portion 6032 and the scanning line driver circuit 6034 are each formed with the thin film transistor which uses a microcrystalline semiconductor film. The shift register 6033b included in the signal line driver circuit is connected to the pixel portion 6032 via an FPC 6035. The pixel portion 6032, the signal line driver circuit, and the scanning line driver circuit 6034 are each supplied with potential of a power source, a variety of signals, and the like via the FPC 6035.

As shown in FIGS. 9A to 9C, in the liquid crystal display device of the present invention, an entire driver circuit or part thereof can be formed over the same substrate as that of a pixel portion, using the thin film transistor which uses a microcrystalline semiconductor film.

Note that there are no particular limitations on a connection method of a separately formed substrate, and a known method such as a COG method, a wire bonding method, or a TAB method can be used. Further, a connection position is not limited to the position shown in FIGS. 9A to 9C, as long as electrical connection is possible. Also, a controller, a CPU, a memory, or the like may be formed separately and connected.

Note that the signal line driver circuit used in the present invention is not limited to a mode including only a shift register and an analog switch. In addition to the shift register and the analog switch, another circuit such as a buffer, a level shifter, or a source follower may be included. Also, the shift register and the analog switch are not always required to be provided, and for example, a different circuit such as a decoder circuit by which selection of signal lines is possible may be used instead of the shift register, and a latch or the like may be used instead of the analog switch.

Then, an external view and a cross section of a liquid crystal display panel which is one mode of the liquid crystal display device of the present invention will be described with reference to FIGS. 11A and 11B. FIG. 11A is a top view of a panel in which a thin film transistor 4010 including a microcrystalline semiconductor film and a liquid crystal element 4013 which are formed over a first substrate 4001 are sealed between the first substrate 4001 and a second substrate 4006 with a sealant 4005, and FIG. 11B corresponds to a cross-sectional view of a cross section taken along a line M-N in FIG. 11A.

The sealant 4005 is provided so as to surround a pixel portion 4002 and a scanning line driver circuit 4004 which are provided over the first substrate 4001. The second substrate 4006 is provided over the pixel portion 4002 and the scanning line driver circuit 4004. Therefore, the pixel portion 4002 and the scanning line driver circuit 4004 as well as a liquid crystal 4008 are sealed between the first substrate 4001 and the second substrate 4006 with the sealant 4005. A signal line driver circuit 4003 formed over a substrate, which is prepared separately, using a polycrystalline semiconductor film is mounted at a region different from the region surrounded by the sealant 4005 over the first substrate 4001. This embodiment mode will describe an example of attaching the signal line driver circuit 4003 including a thin film transistor formed using a polycrystalline semiconductor film to the first substrate 4001. Alternatively, a signal line driver circuit including a thin film transistor, which is formed using a single-crystalline semiconductor film, may be attached to the first substrate 4001. FIG. 11B exemplifies a thin film transistor 4009 formed using a polycrystalline semiconductor film, which is included in the signal line driver circuit 4003.

The pixel portion 4002 and the scanning line driver circuit 4004 which are provided over the first substrate 4001 each include a plurality of thin film transistors. FIG. 11B exemplifies the thin film transistor 4010 included in the pixel portion 4002. The thin film transistor 4010 corresponds to a thin film transistor which uses a microcrystalline semiconductor film and can be formed through the manufacturing steps shown in Embodiment Modes 1 to 4.

In addition, reference numeral 4013 denotes a liquid crystal element. A pixel electrode 4030 of the liquid crystal element 4013 is electrically connected to the thin film transistor 4010 through a wiring 4040. A counter electrode 4031 of the liquid crystal element 4013 is formed on the second substrate 4006. The liquid crystal element 4013 corresponds to a region where the pixel electrode 4030 and the counter electrode 4031 sandwich the liquid crystal 4008.

Note that as the first substrate 4001 and the second substrate 4006, glass, metal (typically, stainless steel), ceramics, or plastic can be used. As for plastic, an FRP (fiberglass-reinforced plastics) plate, a PVF (polyvinyl fluoride) film, a polyester film, or an acrylic resin film can be used. In addition, a sheet with a structure in which an aluminum foil is sandwiched by a PVF film or a polyester film can be used.

A spherical spacer 4035 is provided to control a distance (a cell gap) between the pixel electrode 4030 and the counter electrode 4031. A spacer which is obtained by etching an insulating film as selected may also be used.

A variety of signals and potential are supplied to the signal line driver circuit 4003 which is formed separately, the scanning line driver circuit 4004, or the pixel portion 4002 via wirings 4014 and 4015 from an FPC 4018.

In this embodiment mode, a connecting terminal 4016 is formed of the same conductive film as that of the pixel electrode 4030 included in the liquid crystal element 4013. In addition, the wirings 4014 and 4015 are formed of the same conductive film as that of the wiring 4041.

The connecting terminal 4016 is electrically connected to a terminal included in the FPC 4018 through an anisotropic conductive film 4019.

Although not illustrated, the liquid crystal display device shown in this embodiment mode includes an alignment film, a polarizing plate, and further, may include a color filter and a light-blocking film.

Note that FIGS. 11A and 11B show an example in which the signal line driver circuit 4003 is formed separately and mounted on the first substrate 4001, but this embodiment mode is not limited to this structure. The scanning line driver circuit may be separately formed and then mounted, or only part of the signal line driver circuit or part of the scanning line driver circuit may be separately formed and then mounted.

This embodiment mode can be implemented in combination with the structures of other embodiment modes.

Embodiment Mode 7

Liquid crystal display devices and the like which are obtained according to the present invention can be used for liquid crystal display modules (also referred to as liquid crystal modules). That is, the present invention can be implemented in all electronic devices in which these modules are incorporated into a display portion.

As those kinds of electronic devices, cameras such as video cameras and digital cameras; displays that can be mounted on a person's head (goggle-type displays); car navigation systems; projectors; car stereos; personal computers; portable information terminals (such as mobile computers, cellular phones, and electronic book readers); and the like can be given. Examples of these devices are shown in FIGS. 7A to 7C.

Figure 7A:
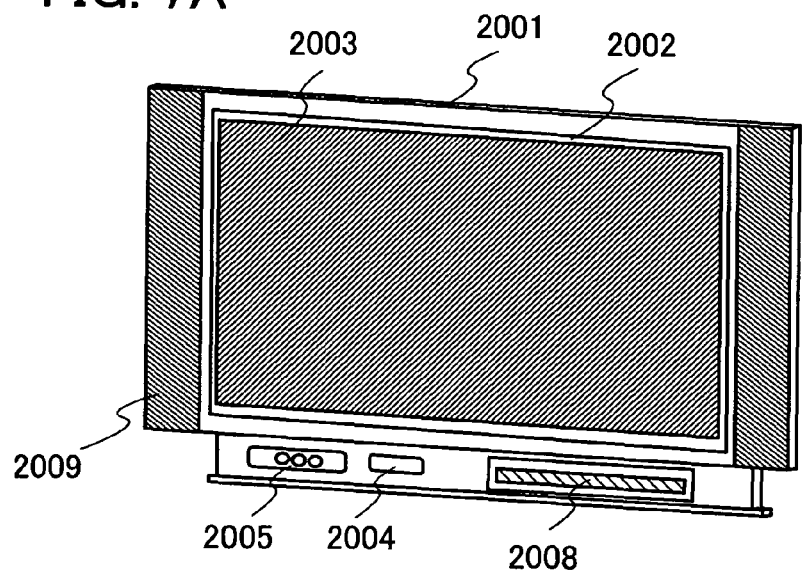
FIGS. 7A to 7C show electronic devices to which the present invention is applied.
Figure 7B:
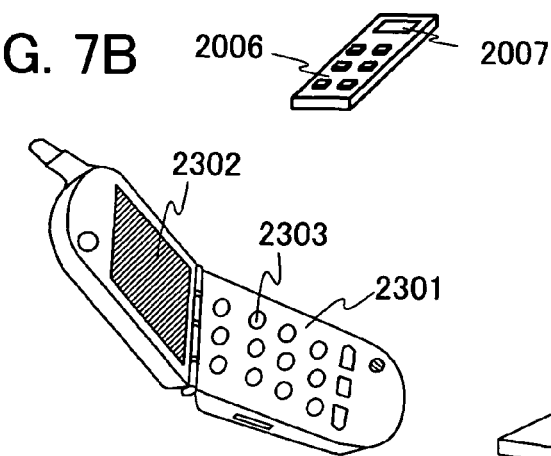
Figure 7C:
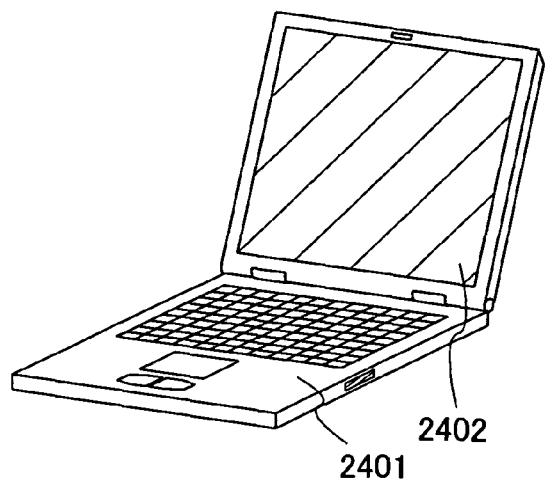

FIG. 7A shows a television device. A television device can be completed by incorporation of a liquid crystal display module into a chassis as shown in FIG. 7A. A liquid crystal display panel including components up to an FPC is also referred to as a liquid crystal display module. A main screen 2003 is formed with a liquid crystal display module, and speaker units 2009, operation switches, and the like are provided as accessory equipment. In this manner, a television device can be completed.

As shown in FIG. 7A, a liquid crystal display panel 2002 using liquid crystal elements is incorporated into a chassis 2001, and in addition to reception of general television broadcast by a receiver 2005, communication of information in one direction (from a transmitter to a receiver) or in two directions (between a transmitter and a receiver or between receivers) can be performed by connection to a wired or wireless communication network via a modem 2004. Operations of the television device can be carried out using switches that are incorporated into the chassis or by a remote control device 2006 provided separately, and a display portion 2007 that displays information to be output may be provided for the remote control device.

Furthermore, in a television device, a sub-screen 2008 may be formed using a second liquid crystal display panel and used to display channel number, volume, and the like, in addition to the main screen 2003.

Figure 8:
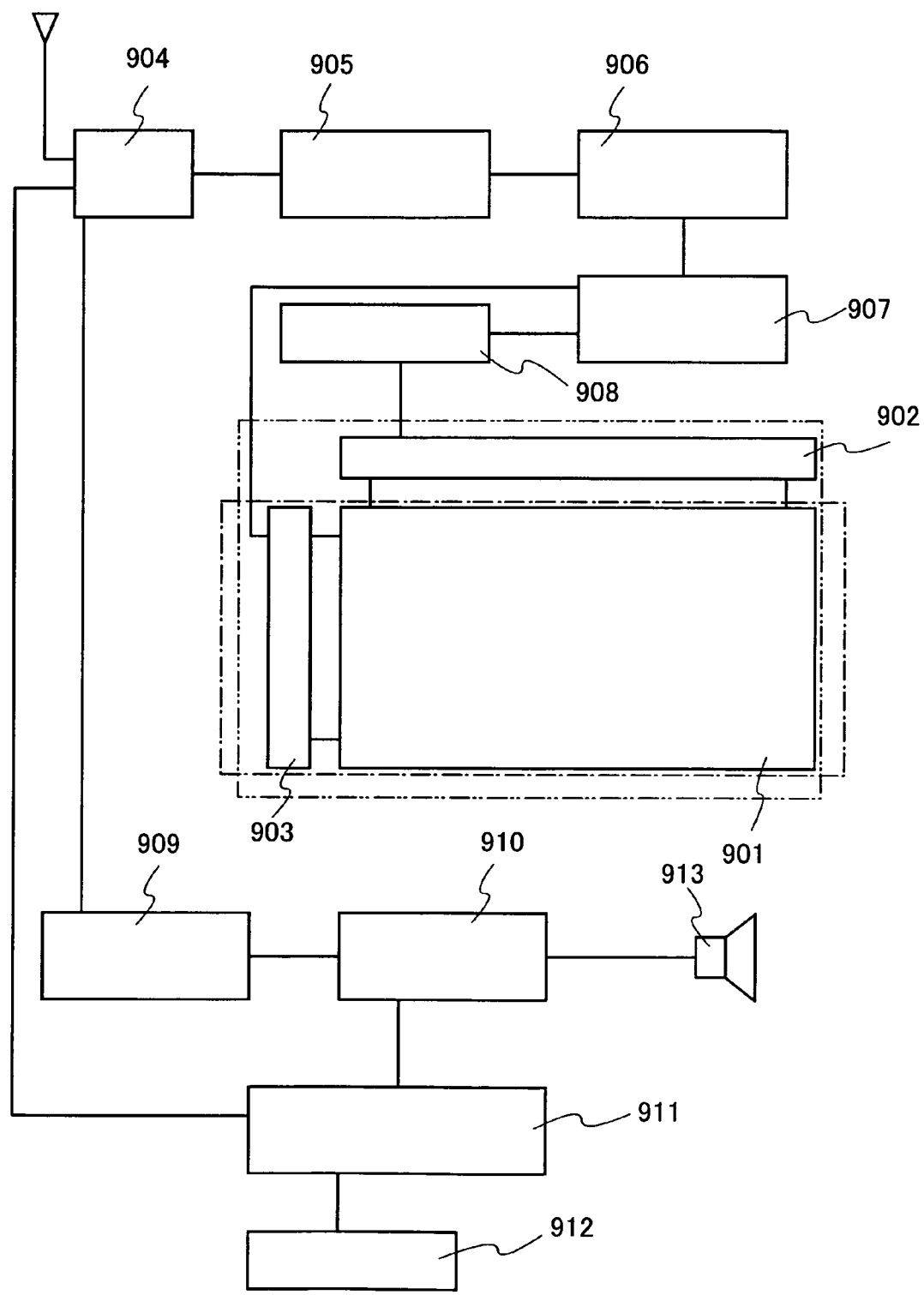
FIG. 8 is a block diagram showing a main structure of an electronic device to which the present invention is applied.

FIG. 8 shows a block diagram showing the main structure of a television device. A pixel portion 901 is formed in the liquid crystal display panel. A signal line driver circuit 902 and a scanning line driver circuit 903 may be mounted on the liquid crystal display panel by a COG method.

As another external circuit, a video signal amplifier circuit 905 which amplifies a video signal among signals received by a tuner 904, a video signal processing circuit 906 which converts the signals output from the video signal amplifier circuit 905 into chrominance signals corresponding to red, green, and blue, a control circuit 907 which converts the video signal into an input specification of the driver IC, and the like are provided on an input side of the video signal. The control circuit 907 outputs signals to a scanning line side and a signal line side. In the case of digital driving, a signal dividing circuit 908 may be provided on the signal line side and an input digital signal may be split into m pieces to be supplied.

Among signals received by the tuner 904, an audio signal is transmitted to an audio signal amplifier circuit 909, and the output thereof is supplied to a speaker 913 through an audio signal processing circuit 910. A control circuit 911 receives control information of a receiving station (reception frequency) or sound volume from an input portion 912 and transmits signals to the tuner 904 and the audio signal processing circuit 910.

The present invention is not limited to the television device and is also applicable to various usages such as display mediums having a large area, for example, a monitor of a personal computer, an information display board at a railway station, an airport, or the like, or an advertisement display board on the street.

FIG. 7B shows an example of a cellular phone 2301. This cellular phone 2301 has a display portion 2302, an operation portion 2303, and the like. When the liquid crystal display device described in the preceding embodiment modes is applied to the display portion 2302, reliability and mass productivity of the cellular phone 2301 can be improved.

A portable computer shown in FIG. 7C includes a main body 2401, a display portion 2402, and the like. When the liquid crystal display device described in the preceding embodiment modes is applied to the display portion 2402, reliability and mass productivity of the portable computer can be improved.

This application is based on Japanese Patent Application Serial No. 2007-190219 filed with Japan Patent Office on Jul. 20, 2007, the entire contents of which are hereby incorporated by reference.

What is claimed is:

1. A liquid crystal display device comprising:
a gate electrode;
a gate insulating film formed over the gate electrode;
a microcrystalline semiconductor film including a channel formation region formed over the gate insulating film;
a buffer layer formed over the microcrystalline semiconductor film;
a channel protective layer which is formed over the buffer layer to overlap with the channel formation region of the microcrystalline semiconductor film;
a source region and a drain region formed over the channel protective layer and the buffer layer; and
a source electrode and a drain electrode formed over the source region and the drain region,
an insulating film formed over the channel protective layer, the source electrode, and the drain electrode,
wherein end portions of the microcrystalline semiconductor film which is formed to overlap with the gate electrode are positioned more inwardly than end portions of the gate electrode.

2. The liquid crystal display device according to claim 1, further comprising a pixel electrode which is electrically connected to the source electrode or the drain electrode.

3. The liquid crystal display device according to claim 1, wherein the buffer layer is formed using an amorphous semiconductor film.

4. The liquid crystal display device according to claim 1, wherein the buffer layer is formed using an amorphous semiconductor film containing nitrogen.

5. The liquid crystal display device according to claim 1, wherein the buffer layer is formed using an amorphous semiconductor film containing hydrogen.

6. The liquid crystal display device according to claim 1, wherein the buffer layer is formed using an amorphous semiconductor film containing fluorine, chlorine, bromine, or iodine.

7. The liquid crystal display device according to claim 1, wherein the buffer layer is formed using an amorphous semiconductor film containing nitrogen, carbon, and oxygen at a total concentration of greater than or equal to $1 \times 10^{20}$ atoms/cm$^3$ and less than or equal to $15 \times 10^{20}$ atoms/cm$^3$.

8. The liquid crystal display device according to claim 1, wherein the source and drain regions extend beyond edges of the source and drain electrodes, and
wherein a distance between edges of the source and drain regions facing each other is shorter than a distance between the edges of the source and drain electrodes facing each other.

9. The liquid crystal display device according to claim 1, wherein the buffer layer has a thickness within a range from 10 nm to 50 nm.

10. A liquid crystal display device comprising:
a gate electrode;
a gate insulating film formed over the gate electrode;
a microcrystalline semiconductor film including a channel formation region formed over the gate insulating film;
a buffer layer formed over the microcrystalline semiconductor film;
a channel protective layer which is formed over the buffer layer to overlap with the channel formation region of the microcrystalline semiconductor film;
a source region and a drain region formed over the channel protective layer and the buffer layer;
a source electrode and a drain electrode formed over the source region and the drain region; and
an insulating film formed over the channel protective layer, the source electrode, and the drain electrode,
wherein the source and drain regions extend beyond edges of the source and drain electrodes, and
wherein a distance between edges of the source and drain regions facing each other is shorter than a distance between the edges of the source and drain electrodes facing each other.

11. The liquid crystal display device according to claim 10, further comprising a pixel electrode formed over the gate insulating film, wherein the pixel electrode is electrically connected to the source electrode or the drain electrode.

12. The liquid crystal display device according to claim 10, wherein the buffer layer is formed using an amorphous semiconductor film.

13. The liquid crystal display device according to claim 10, wherein the buffer layer is formed using an amorphous semiconductor film containing nitrogen.

14. The liquid crystal display device according to claim 10, wherein the buffer layer is formed using an amorphous semiconductor film containing hydrogen.

15. The liquid crystal display device according to claim 10, wherein the buffer layer is formed using an amorphous semiconductor film containing fluorine, chlorine, bromine, or iodine.

16. The liquid crystal display device according to claim 10, wherein the buffer layer is formed using an amorphous semiconductor film containing nitrogen, carbon, and oxygen at a total concentration of greater than or equal to $1 \times 10^{20}$ atoms/cm$^3$ and less than or equal to $15 \times 10^{20}$ atoms/cm$^3$.

17. The liquid crystal display device according to claim 10, wherein end portions of the microcrystalline semiconductor film which is formed to overlap with the gate electrode are positioned more inwardly than end portions of the gate electrode.

18. The liquid crystal display device according to claim 10, wherein the buffer layer has a thickness within a range from 10 nm to 50 nm.

* * * * *